US011271031B2

(12) United States Patent
Mandai et al.

(10) Patent No.: US 11,271,031 B2
(45) Date of Patent: Mar. 8, 2022

(54) BACK-ILLUMINATED SINGLE-PHOTON AVALANCHE DIODE

(71) Applicant: Apple Inc., Cupertino, CA (US)

(72) Inventors: Shingo Mandai, Mountain View, CA (US); Cristiano L. Niclass, San Jose, CA (US); Nobuhiro Karasawa, Tokyo (JP); Xiaofeng Fan, San Jose, CA (US); Arnaud Laflaquiere, Grenoble (FR); Gennadiy A. Agranov, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/876,511

(22) Filed: May 18, 2020

(65) Prior Publication Data

US 2020/0286946 A1    Sep. 10, 2020

Related U.S. Application Data

(63) Continuation of application No. 15/713,520, filed on Sep. 22, 2017, now Pat. No. 10,658,419.

(Continued)

(51) Int. Cl.
*H01L 27/146*     (2006.01)
*G01S 7/4863*     (2020.01)
(Continued)

(52) U.S. Cl.
CPC ...... *H01L 27/14665* (2013.01); *G01S 7/4863* (2013.01); *H01L 27/1461* (2013.01);
(Continued)

(58) Field of Classification Search
CPC ......... H01L 27/14665; H01L 27/14609; H01L 27/14623; H01L 27/14629;
(Continued)

(56) References Cited

U.S. PATENT DOCUMENTS 6,528,833 B2    3/2003    Lee et al.
6,714,239 B2    3/2004    Guidash
(Continued)

FOREIGN PATENT DOCUMENTS

CN    101379615    3/2009
CN    103299437    9/2013
(Continued)

OTHER PUBLICATIONS

Kindt, et al., "A silicon avalanche photodiode for single optical photon counting in the Geiger mode," Sensors and Actuators A: Physical, Elsevier BV, NL, vol. 60, No. 1-3, May 1, 1997, pp. 98-102.

(Continued)

*Primary Examiner* — Albert H Cutler
(74) *Attorney, Agent, or Firm* — Brownstein Hyatt Farber Schreck, LLP

(57) ABSTRACT

A back-illuminated single-photon avalanche diode (SPAD) image sensor includes a sensor wafer stacked vertically over a circuit wafer. The sensor wafer includes one or more SPAD regions, with each SPAD region including an anode gradient layer, a cathode region positioned adjacent to a front surface of the SPAD region, and an anode avalanche layer positioned over the cathode region. Each SPAD region is connected to a voltage supply and an output circuit in the circuit wafer through inter-wafer connectors. Deep trench isolation elements are used to provide electrical and optical isolation between SPAD regions.

18 Claims, 12 Drawing Sheets

Related U.S. Application Data

(60) Provisional application No. 62/398,709, filed on Sep. 23, 2016, provisional application No. 62/398,712, filed on Sep. 23, 2016.

(51) Int. Cl.

| | |
|---|---|
| *H01L 31/107* | (2006.01) |
| *H04N 5/355* | (2011.01) |
| *H04N 5/357* | (2011.01) |
| *H04N 5/369* | (2011.01) |
| *H04N 5/3745* | (2011.01) |
| *H04N 5/376* | (2011.01) |
| *H04N 5/378* | (2011.01) |
| *G01S 7/4861* | (2020.01) |
| *H01L 31/02* | (2006.01) |
| *H01L 31/0352* | (2006.01) |

(52) U.S. Cl.
CPC ...... *H01L 27/1463* (2013.01); *H01L 27/1464* (2013.01); *H01L 27/14603* (2013.01); *H01L 27/14609* (2013.01); *H01L 27/14616* (2013.01); *H01L 27/14623* (2013.01); *H01L 27/14629* (2013.01); *H01L 27/14632* (2013.01); *H01L 27/14634* (2013.01); *H01L 27/14643* (2013.01); *H01L 31/107* (2013.01); *H04N 5/3577* (2013.01); *H04N 5/35572* (2013.01); *H04N 5/3698* (2013.01); *H04N 5/378* (2013.01); *H04N 5/3765* (2013.01); *H04N 5/37452* (2013.01); *G01S 7/4861* (2013.01); *H01L 27/14627* (2013.01); *H01L 31/02027* (2013.01); *H01L 31/03529* (2013.01)

(58) Field of Classification Search
CPC ......... H01L 27/14603; H01L 27/14616; H01L 27/14634; H01L 27/1461; H01L 27/1463; H01L 27/14632; H01L 27/1464; H01L 27/14643; H01L 31/107; H01L 27/14627; H01L 31/02027; H01L 31/03529; G01S 7/4863; G01S 7/4861; H04N 5/35572; H04N 5/3577; H04N 5/37452; H04N 5/3765; H04N 5/378; H04N 5/3698
See application file for complete search history.

(56) References Cited

U.S. PATENT DOCUMENTS

| | | |
|---|---|---|
| 6,905,470 B2 | 6/2005 | Lee et al. |
| 6,931,269 B2 | 8/2005 | Terry |
| 6,982,759 B2 | 1/2006 | Goto |
| 7,075,049 B2 | 7/2006 | Rhodes |
| 7,084,914 B2 | 8/2006 | Blerkom |
| 7,091,466 B2 | 8/2006 | Bock |
| 7,119,322 B2 | 10/2006 | Hong |
| 7,259,413 B2 | 8/2007 | Rhodes |
| 7,262,401 B2 | 8/2007 | Hopper et al. |
| 7,271,836 B2 | 9/2007 | Iizuka et al. |
| 7,282,028 B2 | 10/2007 | Kim et al. |
| 7,319,218 B2 | 1/2008 | Krymski |
| 7,332,786 B2 | 2/2008 | Altice et al. |
| 7,390,687 B2 | 6/2008 | Boettiger et al. |
| 7,415,096 B2 | 8/2008 | Sherman |
| 7,437,013 B2 | 10/2008 | Anderson |
| 7,443,421 B2 | 10/2008 | Stavely et al. |
| 7,446,812 B2 | 11/2008 | Ando et al. |
| 7,453,131 B2* | 11/2008 | Marshall ........... H01L 27/14609 257/438 |
| 7,471,315 B2 | 12/2008 | Silsby et al. |
| 7,502,054 B2 | 3/2009 | Kalapathy et al. |
| 7,525,168 B2 | 4/2009 | Hsieh |
| 7,554,067 B2 | 6/2009 | Zarnowski et al. |
| 7,555,158 B2 | 6/2009 | Park et al. |
| 7,589,316 B2 | 9/2009 | Dunki-Jacobs |
| 7,622,699 B2 | 11/2009 | Sakakibara |
| 7,626,626 B2 | 12/2009 | Panicacci |
| 7,636,109 B2 | 12/2009 | Nakajima et al. |
| 7,667,400 B1 | 2/2010 | Goushcha |
| 7,671,435 B2 | 3/2010 | Ahn |
| 7,696,483 B2 | 4/2010 | Tkaczyk et al. |
| 7,714,292 B2 | 5/2010 | Agarwal et al. |
| 7,728,351 B2 | 6/2010 | Shim |
| 7,733,402 B2 | 6/2010 | Egawa |
| 7,742,090 B2 | 6/2010 | Street et al. |
| 7,764,312 B2 | 7/2010 | Ono et al. |
| 7,773,138 B2 | 8/2010 | Lahav et al. |
| 7,786,543 B2 | 8/2010 | Hsieh |
| 7,796,171 B2 | 9/2010 | Gardner |
| 7,817,198 B2 | 10/2010 | Kang et al. |
| 7,838,956 B2 | 11/2010 | McCarten et al. |
| 7,873,236 B2 | 1/2011 | Li et al. |
| 7,880,785 B2 | 2/2011 | Gallagher |
| 7,884,402 B2 | 2/2011 | Ki |
| 7,906,826 B2 | 3/2011 | Martin et al. |
| 7,952,121 B2 | 3/2011 | Arimoto et al. |
| 7,952,635 B2 | 5/2011 | Lauxtermann |
| 7,982,789 B2 | 7/2011 | Watanabe et al. |
| 8,026,966 B2 | 9/2011 | Altice |
| 8,089,036 B2 | 1/2012 | Manabe |
| 8,089,524 B2 | 1/2012 | Urisaka |
| 8,094,232 B2 | 1/2012 | Kusaka |
| 8,116,540 B2 | 2/2012 | Dean et al. |
| 8,140,143 B2 | 3/2012 | Picard et al. |
| 8,153,947 B2 | 4/2012 | Barbier et al. |
| 8,159,570 B2 | 4/2012 | Negishi |
| 8,159,588 B2 | 4/2012 | Boemler |
| 8,164,669 B2 | 4/2012 | Compton et al. |
| 8,174,595 B2 | 5/2012 | Honda et al. |
| 8,184,188 B2 | 5/2012 | Yaghmai |
| 8,194,148 B2 | 6/2012 | Doida |
| 8,194,165 B2 | 6/2012 | Border et al. |
| 8,222,586 B2 | 7/2012 | Lee |
| 8,227,844 B2 | 7/2012 | Adkisson et al. |
| 8,233,071 B2 | 7/2012 | Takeda |
| 8,259,228 B2 | 9/2012 | Wei et al. |
| 8,324,553 B2 | 12/2012 | Lee |
| 8,338,856 B2 | 12/2012 | Tai et al. |
| 8,340,407 B2 | 12/2012 | Kalman |
| 8,350,940 B2 | 1/2013 | Smith et al. |
| 8,355,117 B2 | 1/2013 | Niclass |
| 8,388,346 B2 | 3/2013 | Rantala et al. |
| 8,400,546 B2 | 3/2013 | Itano et al. |
| 8,456,540 B2 | 6/2013 | Egawa |
| 8,456,559 B2 | 6/2013 | Yamashita et al. |
| 8,508,637 B2 | 8/2013 | Han et al. |
| 8,514,308 B2 | 8/2013 | Itonaga et al. |
| 8,520,913 B2 | 8/2013 | Dean et al. |
| 8,546,737 B2 | 10/2013 | Tian et al. |
| 8,547,388 B2 | 10/2013 | Cheng |
| 8,575,531 B2 | 11/2013 | Hynecek et al. |
| 8,581,992 B2 | 11/2013 | Hamada |
| 8,594,170 B2 | 11/2013 | Members et al. |
| 8,619,163 B2 | 12/2013 | Ogura |
| 8,619,170 B2 | 12/2013 | Mabuchi |
| 8,629,484 B2 | 1/2014 | Ohri et al. |
| 8,634,002 B2 | 1/2014 | Kita |
| 8,637,875 B2 | 1/2014 | Finkelstein |
| 8,648,947 B2 | 2/2014 | Sato et al. |
| 8,653,434 B2 | 2/2014 | Johnson et al. |
| 8,723,975 B2 | 5/2014 | Solhusvik |
| 8,724,096 B2 | 5/2014 | Gosch et al. |
| 8,730,345 B2 | 5/2014 | Watanabe |
| 8,754,983 B2 | 6/2014 | Sutton |
| 8,755,854 B2 | 6/2014 | Addison et al. |
| 8,759,736 B2 | 6/2014 | Yoo |
| 8,760,413 B2 | 6/2014 | Peterson et al. |
| 8,767,104 B2 | 7/2014 | Makino et al. |
| 8,803,990 B2 | 8/2014 | Smith |
| 8,810,703 B2 | 8/2014 | Machida |
| 8,817,154 B2 | 8/2014 | Manabe et al. |
| 8,874,377 B1 | 10/2014 | Sickenberger |

(56) References Cited

U.S. PATENT DOCUMENTS

| | | |
|---|---|---|
| 8,879,686 B2 | 11/2014 | Okada |
| 8,902,330 B2 | 12/2014 | Theuwissen |
| 8,902,341 B2 | 12/2014 | Mabuchi |
| 8,908,073 B2 | 12/2014 | Minagawa et al. |
| 8,923,994 B2 | 12/2014 | Laikari et al. |
| 8,934,030 B2 | 1/2015 | Kim et al. |
| 8,936,552 B2 | 1/2015 | Kateraas et al. |
| 8,946,610 B2 | 2/2015 | Iwabuchi et al. |
| 8,982,237 B2 | 3/2015 | Chen |
| 9,006,641 B2 | 4/2015 | Drader |
| 9,017,748 B2 | 4/2015 | Spelman et al. |
| 9,041,837 B2 | 5/2015 | Li |
| 9,054,009 B2 | 6/2015 | Oike et al. |
| 9,058,081 B2 | 6/2015 | Baxter |
| 9,066,017 B2 | 6/2015 | Geiss |
| 9,066,660 B2 | 6/2015 | Watson et al. |
| 9,088,727 B2 | 7/2015 | Trumbo |
| 9,094,623 B2 | 7/2015 | Kawaguchi |
| 9,099,604 B2 | 8/2015 | Roy et al. |
| 9,100,597 B2 | 8/2015 | Hu |
| 9,106,859 B2 | 8/2015 | Kizuna et al. |
| 9,131,171 B2 | 9/2015 | Aoki |
| 9,151,829 B2 | 10/2015 | Campbell |
| 9,154,750 B2 | 10/2015 | Pang |
| 9,160,949 B2 | 10/2015 | Zhang et al. |
| 9,164,144 B2 | 10/2015 | Dolinsky |
| 9,176,241 B2 | 11/2015 | Frach |
| 9,178,100 B2 | 11/2015 | Webster et al. |
| 9,209,320 B1 | 12/2015 | Webster |
| 9,225,948 B2 | 12/2015 | Hasegawa |
| 9,232,150 B2 | 1/2016 | Kleekajai et al. |
| 9,232,161 B2 | 1/2016 | Suh |
| 9,235,267 B2 | 1/2016 | Burrough et al. |
| 9,257,589 B2 | 2/2016 | Niclass et al. |
| 9,270,906 B2 | 2/2016 | Peng et al. |
| 9,276,031 B2 | 3/2016 | Wan |
| 9,277,144 B2 | 3/2016 | Kleekajai et al. |
| 9,287,304 B2 | 3/2016 | Park et al. |
| 9,288,380 B2 | 3/2016 | Nomura |
| 9,288,404 B2 | 3/2016 | Papiashvili |
| 9,293,500 B2 | 3/2016 | Sharma et al. |
| 9,312,401 B2 * | 4/2016 | Webster ............ H01L 27/14636 |
| 9,313,434 B2 | 4/2016 | Dutton et al. |
| 9,319,611 B2 | 4/2016 | Fan |
| 9,331,116 B2 | 5/2016 | Webster |
| 9,344,649 B2 | 5/2016 | Bock |
| 9,354,332 B2 | 5/2016 | Zwaans et al. |
| 9,392,237 B2 | 7/2016 | Toyoda |
| 9,417,326 B2 | 8/2016 | Niclass et al. |
| 9,431,439 B2 | 8/2016 | Soga et al. |
| 9,438,258 B1 | 9/2016 | Yoo |
| 9,445,018 B2 | 9/2016 | Fettig et al. |
| 9,448,110 B2 | 9/2016 | Wong |
| 9,450,007 B1 | 9/2016 | Motta et al. |
| 9,451,887 B2 | 9/2016 | Watson et al. |
| 9,467,553 B2 | 10/2016 | Heo et al. |
| 9,473,706 B2 | 10/2016 | Malone et al. |
| 9,478,030 B1 | 10/2016 | Lecky |
| 9,479,688 B2 | 10/2016 | Ishii |
| 9,490,285 B2 | 11/2016 | Itonaga |
| 9,503,616 B2 | 11/2016 | Taniguchi et al. |
| 9,516,244 B2 | 12/2016 | Borowski |
| 9,538,106 B2 | 1/2017 | McMahon et al. |
| 9,549,099 B2 | 1/2017 | Fan |
| 9,560,339 B2 | 1/2017 | Borowski |
| 9,596,420 B2 | 3/2017 | Fan et al. |
| 9,639,063 B2 | 5/2017 | Dutton et al. |
| 9,661,308 B1 | 5/2017 | Wang et al. |
| 9,685,576 B2 | 6/2017 | Webster |
| 9,686,485 B2 | 6/2017 | Agranov et al. |
| 9,700,240 B2 | 7/2017 | Letchner et al. |
| 9,741,754 B2 | 8/2017 | Li et al. |
| 9,749,556 B2 | 8/2017 | Fettig et al. |
| 9,774,318 B2 | 9/2017 | Song |
| 9,831,283 B2 | 11/2017 | Shepard et al. |
| 9,857,469 B2 | 1/2018 | Oggier et al. |
| 9,870,053 B2 | 1/2018 | Modarres et al. |
| 9,888,198 B2 | 2/2018 | Mauritzson et al. |
| 9,915,733 B2 | 3/2018 | Fried |
| 9,921,299 B2 | 3/2018 | Kalscheur et al. |
| 9,935,231 B2 | 4/2018 | Roehrer |
| 9,939,316 B2 | 4/2018 | Scott et al. |
| 9,952,323 B2 | 4/2018 | Deane |
| 9,973,678 B2 | 5/2018 | Mandelli et al. |
| 9,985,163 B2 | 5/2018 | Moore |
| 10,026,772 B2 | 7/2018 | Shinohara |
| 10,067,224 B2 | 9/2018 | Moore |
| 10,107,914 B2 | 10/2018 | Kalscheur et al. |
| 10,120,446 B2 | 11/2018 | Pance et al. |
| 10,145,678 B2 | 12/2018 | Wang et al. |
| 10,153,310 B2 | 12/2018 | Zhang et al. |
| 10,217,889 B2 | 2/2019 | Dhulla et al. |
| 10,267,901 B2 | 4/2019 | Drader |
| 10,305,247 B2 | 5/2019 | Bills et al. |
| 10,324,171 B2 | 6/2019 | Niclass et al. |
| 10,334,181 B2 | 6/2019 | Guenter |
| 10,338,221 B2 | 7/2019 | Lee et al. |
| 10,416,293 B2 | 9/2019 | Buckley |
| 10,438,987 B2 * | 10/2019 | Mandai ............ H01L 27/14623 |
| 10,451,736 B2 | 10/2019 | Stutz |
| 10,495,736 B2 | 12/2019 | Zhuang |
| 10,613,225 B2 | 4/2020 | Kubota et al. |
| 10,620,300 B2 | 4/2020 | Sharma et al. |
| 10,651,332 B2 | 5/2020 | Moussy |
| 10,795,001 B2 | 10/2020 | Niclass et al. |
| 10,802,148 B2 | 10/2020 | Lee et al. |
| 2010/0159632 A1 * | 6/2010 | Rhodes ............ H01L 27/14632 438/73 |
| 2012/0162632 A1 | 6/2012 | Dutton |
| 2012/0217601 A1 * | 8/2012 | Miyanami ............ H04N 9/083 257/432 |
| 2014/0291481 A1 * | 10/2014 | Zhang ................ H01L 27/1463 250/208.1 |
| 2015/0243805 A1 * | 8/2015 | Chien ................ H01L 27/1464 257/432 |
| 2018/0019268 A1 * | 1/2018 | Zhang .................. H01L 31/107 |
| 2018/0090526 A1 | 3/2018 | Mandai et al. |
| 2018/0209846 A1 | 7/2018 | Mandai et al. |
| 2018/0341009 A1 | 11/2018 | Niclass et al. |
| 2019/0018119 A1 | 1/2019 | Laifenfeld et al. |
| 2019/0198701 A1 | 6/2019 | Moussy |
| 2019/0277970 A1 * | 9/2019 | Deane .................. G01S 17/894 |
| 2020/0278429 A1 | 9/2020 | Mandai et al. |

FOREIGN PATENT DOCUMENTS

| | | |
|---|---|---|
| CN | 103779437 | 5/2014 |
| CN | 104103655 | 10/2014 |
| CN | 104779259 | 7/2015 |
| CN | 104810377 | 7/2015 |
| CN | 105185796 | 12/2015 |
| CN | 105489624 | 4/2016 |
| DE | 102010060527 | 4/2012 |
| EP | 0727824 | 8/1995 |
| EP | 2787531 | 10/2014 |
| JP | 2004319576 | 11/2004 |
| JP | 2012038981 | 2/2012 |
| JP | 2012169530 | 9/2012 |
| JP | 2014081254 | 5/2014 |
| JP | 2014225647 | 12/2014 |
| JP | 2015041746 | 3/2015 |
| JP | 2016145776 | 8/2016 |
| WO | WO 12/011095 | 1/2012 |
| WO | WO 12/032353 | 3/2012 |
| WO | WO 17/112416 | 6/2017 |
| WO | WO 20/045123 | 3/2020 |

OTHER PUBLICATIONS

Charbon, et al., SPAD-Based Sensors, *TOF Range-Imaging Cameras*, F. Remondino and D. Stoppa (eds.), 2013, Springer-Verlag Berlin Heidelberg, pp. 11-38.

(56) References Cited

OTHER PUBLICATIONS

Cox, "Getting histograms with varying bin widths," http://www.stata.com/support/faqs/graphics/histograms-with-varying-bin-widths/, Nov. 13, 2017, 5 pages.

Gallivanoni, et al., "Progress n Quenching Circuits for Single Photon Avalanche Diodes," IEEE Transactions on Nuclear Science, vol. 57, No. 6, Dec. 2010, pp. 3815-3826.

Jahromi et al., "A Single Chip Laser Radar Receiver with a 9x9 SPAD Detector Array and a 10-channel TDC," 2013 Proceedings of the ESSCIRC, IEEE, Sep. 14, 2015, pp. 364-367.

Leslar, et al., "Comprehensive Utilization of Temporal and Spatial Domain Outlier Detection Methods for Mobile Terrestrial LiDAR Data," *Remote Sensing*, 2011, vol. 3, pp. 1724-1742.

Mota, et al., "A flexible multi-channel high-resolution Time-to-Digital Converter ASIC," *Nuclear Science Symposium Conference Record IEEE*, 2000, Engineering School of Geneva, Microelectronics Lab, Geneva, Switzerland, 8 pages.

Niclass, et al., "Design and Characterization of a CMOS 3-D Image Sensor Based on Single Photon Avalanche Diodes," *IEEE Journal of Solid-State Circuits*, vol. 40, No. 9, Sep. 2005, pp. 1847-1854.

Shin, et al., "Photon-Efficient Computational 3D and Reflectivity Imaging with Single-Photon Detectors," IEEE International Conference on Image Processing, Paris, France, Oct. 2014, 11 pages.

Tisa, et al., "Variable-Load Quenching Circuit for single-photon avalanche diodes," Optics Express, vol. 16, No. 3, Feb. 4, 2008, pp. 2232-2244.

Ullrich, et al., "Linear LIDAR versus Geiger-mode LIDAR: Impact on data properties and data quality," *Laser Radar Technology and Applications XXI*, edited by Monte D. Turner, Gary W. Kamerman, Proc. of SPIE, vol. 9832, 983204, 2016, 17 pages.

\* cited by examiner

BACK-ILLUMINATED SINGLE-PHOTON AVALANCHE DIODE

CROSS-REFERENCE TO RELATED APPLICATION(S)

This application is a continuation of U.S. Nonprovisional patent application Ser. No. 15/713,520, filed Sep. 22, 2017, and entitled "Stacked Backside Illuminated SPAD Array," which claims the benefit under 35 U.S.C. § 119(e) of U.S. Provisional Patent Application No. 62/398,712, filed on Sep. 23, 2016, and entitled "Back-Illuminated SPAD Image Sensor," and 62/398,709, filed on Sep. 23, 2016, and entitled "Back-Illuminated SPAD Image Sensor," all of which are hereby incorporated by reference as if fully disclosed herein.

FIELD

The described embodiments relate generally to single-photon avalanche diode (SPAD) image sensors.

BACKGROUND

Image sensors are used in a variety of electronic devices, such as digital cameras, cellular phones, copiers, medical imaging devices, security systems, and time-of-flight cameras. An image sensor typically includes an array of photodetectors that detect or respond to incident light. One type of photodetector that can be used in an image sensor is a single-photon avalanche diode (SPAD) region. An SPAD region is a photosensitive region that is configured to detect low levels of light (down to a single photon) and to signal the arrival times of the photons.

Monolithically-integrated SPAD image sensors typically include an array of SPAD regions and electrical circuitry for the SPAD regions. However, the fill factor of the array can be limited because the electrical circuitry for the SPAD regions consumes space on the semiconductor wafer. Additionally, it can be difficult to prevent contamination of the semiconductor wafer during fabrication of the monolithically-integrated SPAD image sensor. Metals and other contaminants may adversely impact the performance of the SPAD image sensor, such as by increasing noise in the SPAD image sensor.

In some instances, there can be a trade-off between the photon detection efficiency and the timing response of the SPAD regions. A thicker semiconductor wafer can improve the photon detection efficiency of the SPAD regions, but a thicker semiconductor wafer may reduce the timing resolution or response time of the SPAD regions because the charge carriers must propagate through the thicker semiconductor wafer. Additionally, a thicker semiconductor wafer can cause a higher breakdown voltage, which increases the power consumption of the SPAD image sensor when the SPAD image sensor is operating in Geiger mode.

SUMMARY

In one aspect, a back-illuminated single-photon avalanche diode (SPAD) image sensor includes a sensor wafer and a circuit wafer positioned below and attached to the sensor wafer. The sensor wafer includes an SPAD region that comprises a cathode region that includes a first dopant type, an anode avalanche layer positioned over the cathode region and comprising a second dopant type, and an anode gradient layer comprising the second dopant type. The anode gradient layer includes a back edge dopant concentration gradient that extends from a back surface of the anode gradient layer, a first side edge dopant concentration gradient that extends from an interior of the anode gradient layer to a first edge of the anode gradient layer, and a second side edge dopant concentration gradient that extends from an interior of the anode gradient layer to a second edge of the anode gradient layer. The back-illuminated SPAD sensor may include a guard ring layer adjacent to an avalanche region within the cathode region and the anode avalanche layer. The guard ring layer is doped with the first dopant type and a dopant concentration of the guard ring layer is less than a dopant concentration of the cathode region. The back-illuminated SPAD sensor may also include a deep trench isolation region adjacent to the SPAD region.

In another aspect, a back-illuminated single-photon avalanche diode (SPAD) image sensor is disclosed. The SPAD image sensor includes a sensor wafer and a circuit wafer that is positioned below the sensor wafer. The sensor wafer includes a SPAD region that includes: an anode gradient layer comprising a first dopant; a cathode region positioned adjacent to a front surface of the sensor wafer and comprising a second dopant; an anode avalanche layer positioned over the cathode region and comprising the first dopant; and a guard ring layer comprising the second dopant type and adjacent to an avalanche region between the cathode region and the anode avalanche layer. The dopant concentration of the guard ring is lower than a dopant concentration of the cathode region. The lower dopant concentration in the guard ring layer may produce a lower electric field at an edge of an avalanche region that is formed between the anode avalanche region and the cathode region. The area of the cathode region is substantially equal to the area of the anode region. The anode gradient layer may include a back edge dopant concentration gradient that extends from a back surface of the anode gradient layer, a first side edge dopant concentration gradient that extends from an interior of the anode gradient layer to a first side edge of the anode gradient layer, and a second side edge dopant concentration gradient that extends from the interior of the anode gradient layer to a second side edge of the anode gradient layer.

In yet another aspect, an electronic device includes a back-illuminated single-photon avalanche diode (SPAD) image sensor operably coupled to a processing device. The SPAD image sensor in turn includes a sensor wafer and a circuit wafer stacked below the sensor wafer. The sensor wafer includes a first and a second SPAD region. Each SPAD region includes: an anode gradient layer comprising a first dopant type; a cathode region positioned adjacent to a front surface of the SPAD region and comprising a second dopant type; and an anode avalanche layer positioned over the cathode region and comprising the first dopant type. The anode gradient layer includes a back edge dopant concentration gradient that extends from a back surface of the anode gradient layer; first side edge dopant concentration gradient that extends from an interior of the anode gradient layer to a first side edge of the anode gradient layer; and a second side edge dopant concentration gradient that extends from the interior of the anode gradient layer to a second side edge of the anode gradient layer. The processing device is configured to receive output signals from the back-illuminated SPAD image sensor, and determine one or more characteristics associated with a reflected light received in the SPAD image sensor based on the received output signals. The first and second SPAD regions may each include a guard ring layer adjacent to an avalanche region that is formed between the cathode region and the anode avalanche layer, wherein the guard ring layer is doped with the second dopant type and a dopant concentration in the guard ring layer is less than a dopant concentration in the cathode region.

BRIEF DESCRIPTION OF THE DRAWINGS

The disclosure will be readily understood by the following detailed description in conjunction with the accompanying drawings, wherein like reference numerals designate like structural elements.

Figure 1:
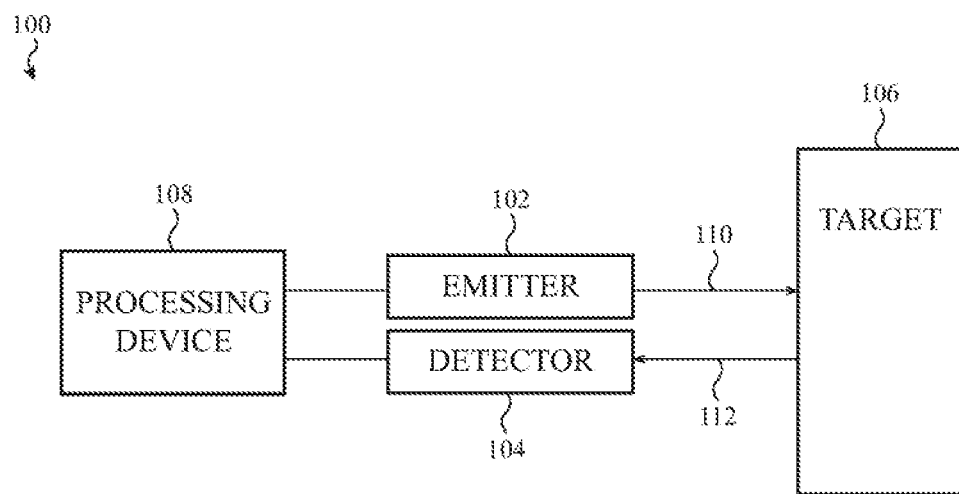
FIG. 1 shows one example of a system that includes one or more SPAD image sensors.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates to a back-illuminated single-photon avalanche diode (SPAD) image sensor. The SPAD image sensor includes a sensor wafer and a separate circuit wafer that is attached or bonded to a front surface of the sensor wafer. The sensor wafer includes one or more SPAD regions. Each SPAD region includes a light sensing semiconductor section and functions as a pixel element of the SPAD image sensor, i.e., it receives photons and generates current. The semiconductor section of each SPAD is configured as a diode. The SPAD region is enabled to detect light by reverse biasing the diode section into its avalanche region. Incoming photons generate charge carriers that induce avalanche current. The circuit wafer includes electrical circuitry that connects to the SPAD region(s) and detects the avalanche current. In some embodiments, each SPAD region is connected to at least one voltage supply through a first inter-wafer connector and to an output circuit through a second inter-wafer connector.

Because the sensor wafer primarily includes the SPAD regions, the fabrication process of the sensor wafer can be optimized for the production of the SPAD regions. Similarly, the fabrication process of the circuit wafer may be optimized for the electrical circuitry in the circuit wafer. Contamination of the sensor wafer is reduced or eliminated because the electrical circuitry is not included in the sensor wafer.

As explained more fully below, some SPAD regions include a surface (termed the "back surface") configured to receive light, an anode gradient layer that is configured to guide photon-generated charge carriers (e.g., electrons) from the side edges of the anode gradient layer to the interior (i.e., middle) of the anode gradient layer. The charge carrier is then guided toward an anode avalanche layer of the SPAD region. In the anode avalanche layer the charge carrier induces further generation of charge carriers, which combine with opposite type charge carriers in the cathode region. The result is a current pulse entering the SPAD region. In one embodiment, the SPAD region includes a first side edge dopant concentration gradient situated adjacent to a first side edge of the SPAD region (e.g., the left side edge) and a second side edge dopant concentration gradient situated adjacent to an opposite side edge of the SPAD region (e.g., the right side edge). Another dopant concentration gradient may increase vertically within the anode gradient layer from a lightly doped layer to the back surface of the anode gradient layer or SPAD region.

In some embodiments, a guard ring layer can be positioned adjacent or next to the anode avalanche layer and the cathode region in each SPAD region. The guard ring layer is configured to relax the maximum electric field between the cathode region and the anode avalanche layer. The width and length of the anode avalanche layer may be extended based on the guard ring layer.

Deep trench isolation (DTI) regions are disposed in the sensor wafer adjacent to and around the SPAD regions. The DTI regions extend from the back surface of the sensor wafer to a front surface of the SPAD region to reduce or suppress electrical and optical crosstalk. In some embodiments, the DTI regions extend through the back surface (the light receiving surface) of the sensor wafer. Light shields can be positioned over the back surface of the sensor wafer (e.g., over the DTI regions) to further reduce optical crosstalk.

The exterior surfaces of the DTI regions, such as those forming side walls of the semiconductor section volume of a SPAD region, can have pinning and/or passivation layers. In some embodiments, a doped well can be positioned over a portion of the DTI regions adjacent to the front surface of the SPAD regions to provide an electrical connection to the SPAD regions. When a pinning layer is positioned over the exterior surfaces of the DTI regions, the doped well may connect to the pinning layer.

In some embodiments, an electrical connection is made between an isolation voltage source, separate from the reverse biasing voltage source, and a conductive material contained in a DTI region. The isolation voltage applied to the conductive material can prevent cross talk between SPAD regions, and direct photon generated charge carriers to the avalanche region. The connection may be made through vias in the DTI regions of the SPAD regions. Other vias may be part of the DTI regions to allow a connection with the reverse bias voltage source. Vias used through DTI regions can allow for larger areas devoted to light gathering.

Furthermore, a light reflector may be positioned below at least a portion of each SPAD region to reflect photons not initially detected back into the SPAD region of the sensor wafer to induce charge carrier generation. Reflecting photons back into the SPAD region can increase the photon detection efficiency (PDE) of each SPAD region because the reflected photons can produce additional photon-generated charge carriers.

These and other embodiments are discussed below with reference to FIGS. 1-8. However, those skilled in the art will readily appreciate that the detailed description given herein with respect to these Figures is for explanatory purposes only and should not be construed as limiting.

FIG. 1 shows one example of system that includes one or more SPAD image sensors. The system 100 includes an emitter 102, a detector 104, and a target 106. The emitter 102 and the detector 104 each represent one or more emitters and detectors, respectively. The emitter 102 is positioned to emit light towards the target 106 and the detector 104 is situated to detect light reflected from the scene and/or the target 106.

A processing device 108 is operably connected to the emitter 102 and to the detector 104. When light is to be detected, the processing device 108 causes the emitter 102 to emit light towards the target 106 (emitted light represented by arrow 110). The light reflected from the target 106 is then detected by the detector 104 (reflected light represented by arrow 112). The processing device 108 receives the output signals from the detector 104 and processes the output signals to determine one or more characteristics associated with the reflected light, the target 106, and/or the scene.

Figure 2:
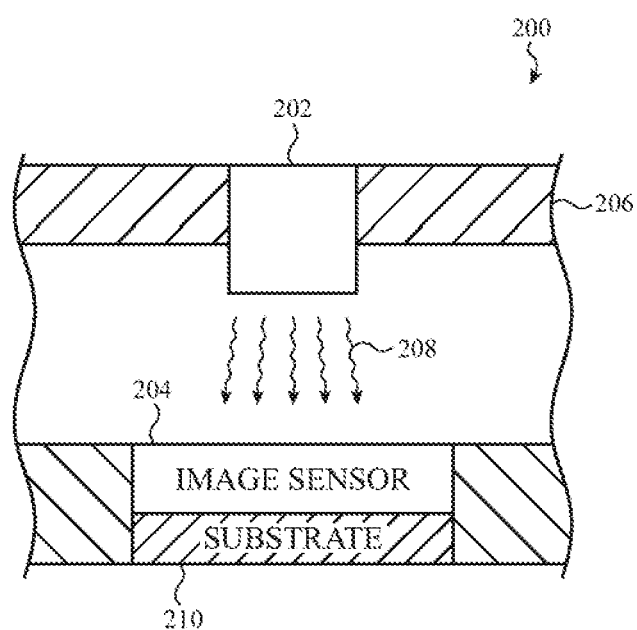
FIG. 2 depicts a cross-sectional view of one example of the detector shown in FIG. 1.

FIG. 2 depicts a cross-sectional view of one example of the detector shown in FIG. 1. The detector 200 includes an imaging stage 202 that is in optical communication with an SPAD image sensor 204. The imaging stage 202 is operably connected to an enclosure 206 of the detector 200 and is positioned in front of the SPAD image sensor 204. The imaging stage 202 can include conventional elements such as a lens, a filter, an iris, and a shutter. The imaging stage 202 directs, focuses, or transmits light 208 within its field of view onto the SPAD image sensor 204. The SPAD image sensor 204 detects the light (e.g., the reflected light 112 in FIG. 1) by converting the incident photons into electrical signals.

The SPAD image sensor 204 can include, or be supported by, a support structure 210. The support structure 210 can be a semiconductor-based material including, but not limited to, silicon, silicon-on-insulator (SOI) technology, silicon-on-sapphire (SOS) technology, doped and undoped semiconductors, epitaxial layers formed on a semiconductor substrate, well regions or buried layers formed in a semiconductor substrate, and other semiconductor structures.

Figure 8:
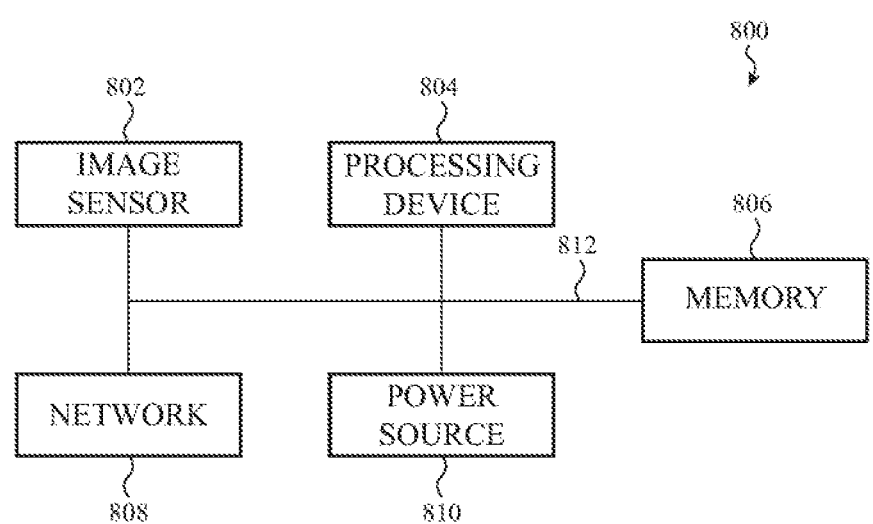
FIG. 8 depicts a block diagram of an electronic device that includes one or more back-illuminated SPAD image sensors.

Various elements of the imaging stage 202 or the SPAD image sensor 204 can be controlled by timing signals or other signals supplied from a processing device or memory (e.g., processing device 108 in FIG. 1, processing device 804 in FIG. 8, and memory 806 in FIG. 8). Some or all of the elements in the imaging stage 202 can be integrated into a single component. Additionally, some or all of the elements in the imaging stage 202 can be integrated with the SPAD image sensor 204, and possibly one or more additional elements of the detector 200, to form a camera module. For example, a processor or a memory may be integrated with the SPAD image sensor 204 in some embodiments.

Figure 3A:
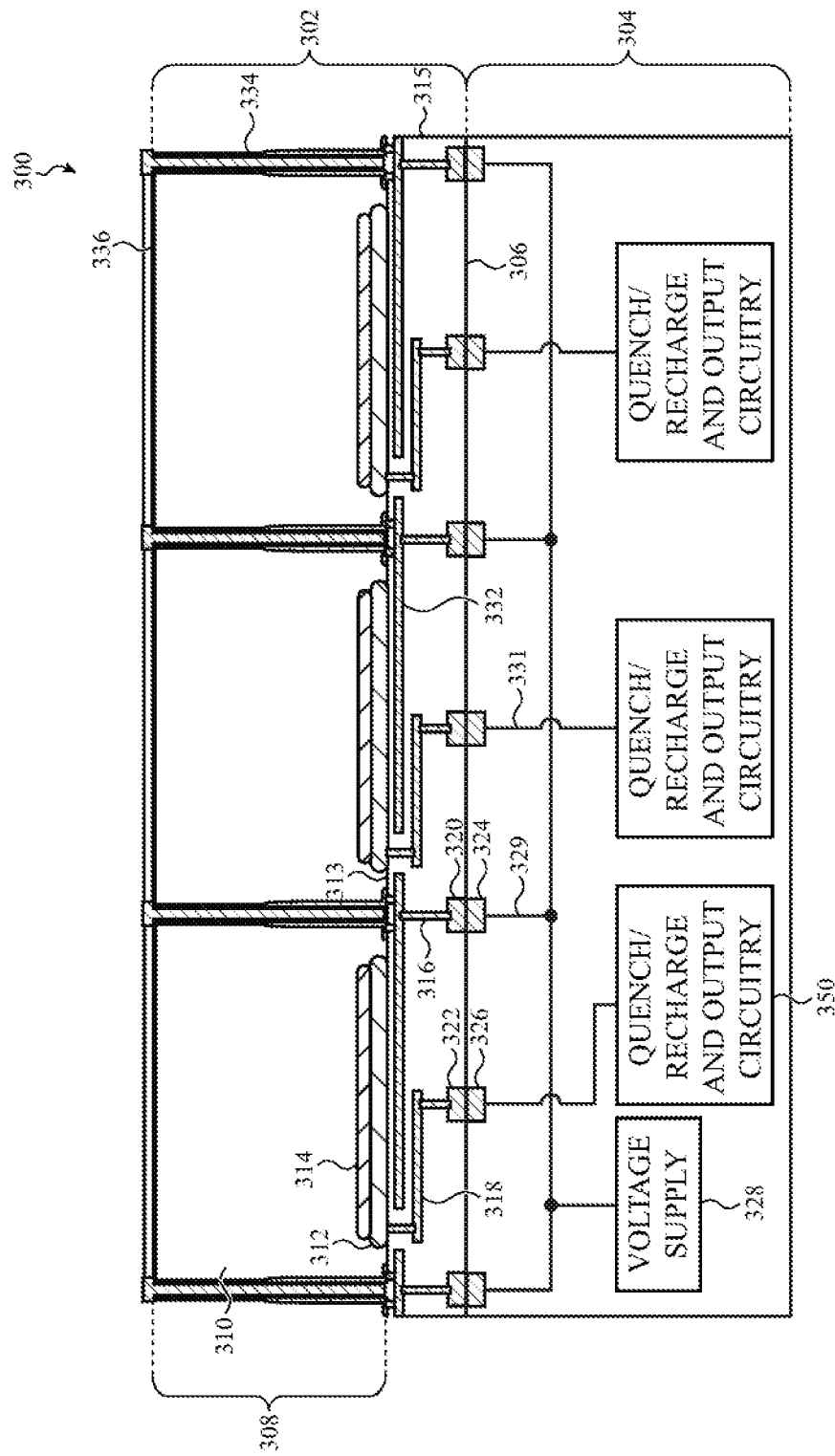
FIG. 3A shows a cross-sectional view of one example of a back-illuminated SPAD image sensor.

FIG. 3A shows a cross-sectional view of one example of a back-illuminated SPAD image sensor. The back-illuminated SPAD image sensor 300 includes a sensor wafer 302 stacked vertically over a circuit wafer 304. In particular, a back surface of the circuit wafer 304 is attached or bonded to a front surface of the sensor wafer 302 at interface 306. Although FIG. 3A depicts only one circuit wafer 304, other embodiments can include multiple circuit wafers.

The sensor wafer 302 and the circuit wafer 304 can each be formed of any suitable material. In one embodiment, the sensor wafer 302 and the circuit wafer 304 are formed with a semiconductor-based material. As described earlier, example semiconductor-based materials include silicon, silicon-insulator-silicon, silicon on sapphire, doped and undoped semiconductors. The sensor wafer 302 and the circuit wafer 304 can be formed as epitaxial layers formed on a semiconductor substrate, as well as regions or buried layers formed in a semiconductor substrate, and other similar structures.

In the illustrated embodiment of FIG. 3A, the sensor wafer 302 includes an array of SPAD regions 308. Each SPAD region 308 includes an anode region and a cathode region to implement a diode structure. The anode region includes an anode avalanche layer 314 and an anode gradient layer 310, both doped with a first dopant type. The cathode region 312 is doped with a second dopant type. In some embodiments the anode region comprises p-type doped silicon, and the cathode region 312 comprises n-type doped silicon. However, it is also possible for the embodiments described below to have these doping types reversed, or to use alternative semiconductor materials. The cathode region 312 is situated at the side of the anode gradient layer 310 that is nearer the interface 306 between the sensor wafer 302 and the circuit wafer 304. For example, the cathode region 312 may be situated at the front surface of the anode gradient layer 310 at the interface 313 between the semiconductor-based anode gradient layer 310 and a silicon dioxide layer 315. The cathode region 312 has a first lateral width (see W1 in FIG. 7) and a first lateral length (see L1 in FIG. 7). The SPAD regions are shaped substantially as parallel columns. The end surfaces of the columns, such as back surface 336 and interface 313, may be shaped as squares, rectangles, ellipses or other planar shapes. The lateral dimensions thereof refer to maximum extents of the front and back surfaces in two perpendicular directions, and do not necessarily imply a rectangular shape of the front or back surface. The distance from the back surface 336 and interface 313 may be greater, less than or equal to either of the lateral width and length of a SPAD region.

The anode gradient layer 310 forms part of an anode region of a diode structure, with the cathode region 312 forming the cathode of the diode structure. The anode region also includes anode avalanche layer 314 that is formed over the cathode region 312, and which also is doped with the first dopant type. The anode avalanche layer 314 has a second lateral width and a second lateral length (respectively W2 and L2 for the specific shape shown in FIG. 7). In some embodiments, W2 is less than W1 and L2 is less than L1 such that the area (L2×W2) of the anode avalanche layer 314 is less than the area (L1×W1) of the cathode region 312. Edge breakdown is reduced or avoided when the area of the anode avalanche layer 314 is less than the area of the cathode region 312.

The anode avalanche layer 314 may be a region that is specifically produced within the anode gradient layer 310 during manufacture of the sensor wafer. When no reverse bias is applied to the SPAD regions 308, the anode avalanche layer 314 may encompass all or part of the depletion region that forms at the p-n junction formed with the cathode region 312, the cathode region being surrounded by the depletion region. The anode gradient layer 310 and the anode avalanche layer 314 together will be termed the anode region.

The p-n junctions between the anode regions and the cathode regions 312 are reversed biased at or above the breakdown voltage when the SPAD regions 308 are enabled to detect light. When so enabled, photons of light that enter the anode gradient layer 310 through the back surfaces 336 generate photon-generated charge carriers (e.g., an electron) by electron-hole creation. The photon-generated charge carriers are injected into a reverse bias enlarged depletion region of the anode gradient layer 310 (see, e.g., depletion layer 418 in FIG. 4A). This can trigger a self-sustaining avalanche that causes an output signal (e.g., a current) at the output of the SPAD region 308 to rise quickly. The leading edge of the current output pulse marks the arrival time of the detected photons. The current continues until the avalanche is quenched by lowering the bias voltage down to, or below, the breakdown voltage. In some embodiments the avalanche region may be fully depleted just before reaching the breakdown voltage. (Hereinafter, a "depleted" region or layer will be understood to mean "fully depleted"). The SPAD region 308 is essentially reset when the bias voltage decreases to, or below, the breakdown voltage, or just below in certain embodiments. After a period of time, the bias voltage is restored to a level that is greater than the breakdown voltage and the SPAD region 308 is able to detect another photon. The breakdown voltage for an SPAD region 308 can be based at least in part on the semiconductor material of the sensor wafer 302, the structure of the SPAD region 308, and the temperature.

Included in a silicon dioxide layer 315 of the sensor wafer 302 and positioned below the SPAD regions 308 are first connectors 316, second connectors 318, first contact pads 320, and second contact pads 322. The first connectors 316 connect the SPAD regions 308 to the first contact pads 320. The second connectors 318 connect the cathode regions 312 to the second contact pads 322.

The circuit wafer 304 includes third contact pads 324, fourth contact pads 326, one or more voltage supplies 328, and quench/recharge and output circuitry 350. Although not shown in FIG. 3A, the circuit wafer 304 may include additional components and/or circuitry. For example, the circuit wafer 304 may include multiple voltage supplies in other embodiments. At least one voltage supply 328 can be configured to provide a high voltage to reverse bias the p-n junction, and the same voltage supply 328, or another voltage supply 328, may be configured to provide a bias voltage for the deep trench isolation (DTI) regions 334 and/or other layers, wells, and/or doped regions in the sensor wafer 302.

The third contact pad 324 is connected to the first contact pad 320 in the sensor wafer 302 while the fourth contact pad 326 is connected to the second contact pad 322 in the sensor wafer 302. Any suitable process can be used to attach or bond the first contact pad 320 to the third contact pad 324, and to attach the second contact pad 322 to the fourth contact pad 326. One example bonding method is a copper-to-copper bonding process.

The voltage supply 328 is connected to the third contact pads 324 through the third connectors 329. The voltage supply 328 is configured to provide at least a high reverse bias voltage to the diode sections SPAD regions 308 to reverse bias the p-n junctions at or above the breakdown voltage. The voltage supply 328 may also apply a second isolation voltage to conductive materials in the DTI regions of the SPAD regions to increase electrical and optical isolation between the SPAD regions.

Each quench/recharge and output circuitry 350 is connected to a respective fourth contact pad 326 through a fourth connector 331, and includes a quenching and recharging circuit and an output circuit. The quench/recharge and output circuit 350 may also include other circuits or components. The quenching and recharging circuits are configured to quench the avalanche current and restore the bias voltage to a level that is greater than the breakdown voltage. Any suitable digital and/or analog circuits can be used to implement the quenching and recharging circuits. A particular example quench/recharge and output circuit 350 is discussed below in relation to FIG. 3C.

The output circuits are configured to receive the output signals from a respective SPAD region 308 and to count the number of output pulses that are received from the SPAD region 308. The intensity of the light that is received by an SPAD region 308 is determined by the output signal pulses (which depends on the number of photons) that are detected over a given period of time. Any suitable digital and/or analog circuits can be used to implement the output circuits. For example, in some embodiments, each output circuit 350 includes one or more transistors that read out the output signals and/or amplify the output signals and a counter circuit that receives the output signals from the transistor(s). Alternatively, a time-to-digital converter circuit can be used.

A first electrical connection between the sensor wafer and the circuit wafer is formed by a first connector 316, a first contact pad 320, a third contact pad 324, and a third connector 329. Similarly, a second connector 318, a second contact pad 322, a fourth contact pad 326, and a fourth connector 331 form a second connection between the sensor wafer and the circuit wafer.

In some embodiments, the first connectors 316 may connect with include a lateral shield 332 that extends laterally below at least a portion of the SPAD region 308. In some embodiments, the lateral shields 332 are coupled to the first connectors 316 and can be biased either at the reverse bias voltage or at a different voltage, such as a reference voltage (e.g., ground). In other embodiments, the lateral shields 332 may be separate or detached from the first connectors 316. The lateral shields 332 can function as a reflective element that reflects photons back into the SPAD regions 308 (e.g., to the anode gradient layers 310). The reflected photons are able to generate additional charge carriers, which can increase the photon detection efficiency (PDE) of each SPAD region 308. The increased PDE may be achieved without increasing the thickness of the sensor wafer 302. Thus, the lateral shields 332 can assist in maintaining or improving the timing performances of the SPAD regions 308 because the lateral shields 332 lessen or eliminate the need to increase the thickness of the sensor wafer 302.

A potential problem is that incoming photons entering a first SPAD region 308 can propagate to an adjacent or neighboring SPAD region 308 as a result of the photons reflecting to a neighboring SPAD region 308 (optical crosstalk), penetrating a neighboring SPAD region 308 due to avalanche light emission (optical crosstalk), and/or a charge carrier migrating to a neighboring SPAD region 308 (electrical crosstalk). To reduce or suppress the optical and electrical crosstalk, DTI regions 334 are positioned between adjacent SPAD regions 308. The DTI regions 334 electrically and optically isolate each SPAD region 308 from neighboring SPAD regions 308. Each DTI region 334 can extend from the front surface of the SPAD regions 308 (e.g., from the cathode regions 312) to the back surface 336 of the sensor wafer 302. In some embodiments, each DTI region 334 extends through the back surface 336 of the sensor wafer 302 to provide greater isolation between SPAD regions 308. Different embodiments of the DTI regions 334 are discussed in more detail in conjunction with FIG. 4D.

In some embodiments, a passivation and/or pinning layer can be positioned over the sides or exterior surfaces of the DTI regions 334. In other embodiments, a pinning layer doped with the first dopant type may extend along the sides or the exterior surfaces of the DTI regions 334. The pinning layers provide an electrical connection between the back surface 336 and the first contact pads 320.

Additionally, in some embodiments, the voltage supply 328 can apply a second isolation voltage to the passivation/pinning layers via the third connectors 329, the third contact pads 324, the first contact pads 320, and the first connectors 316. Each first connector 316 may connect to a respective DTI region 334.

Figure 3B:
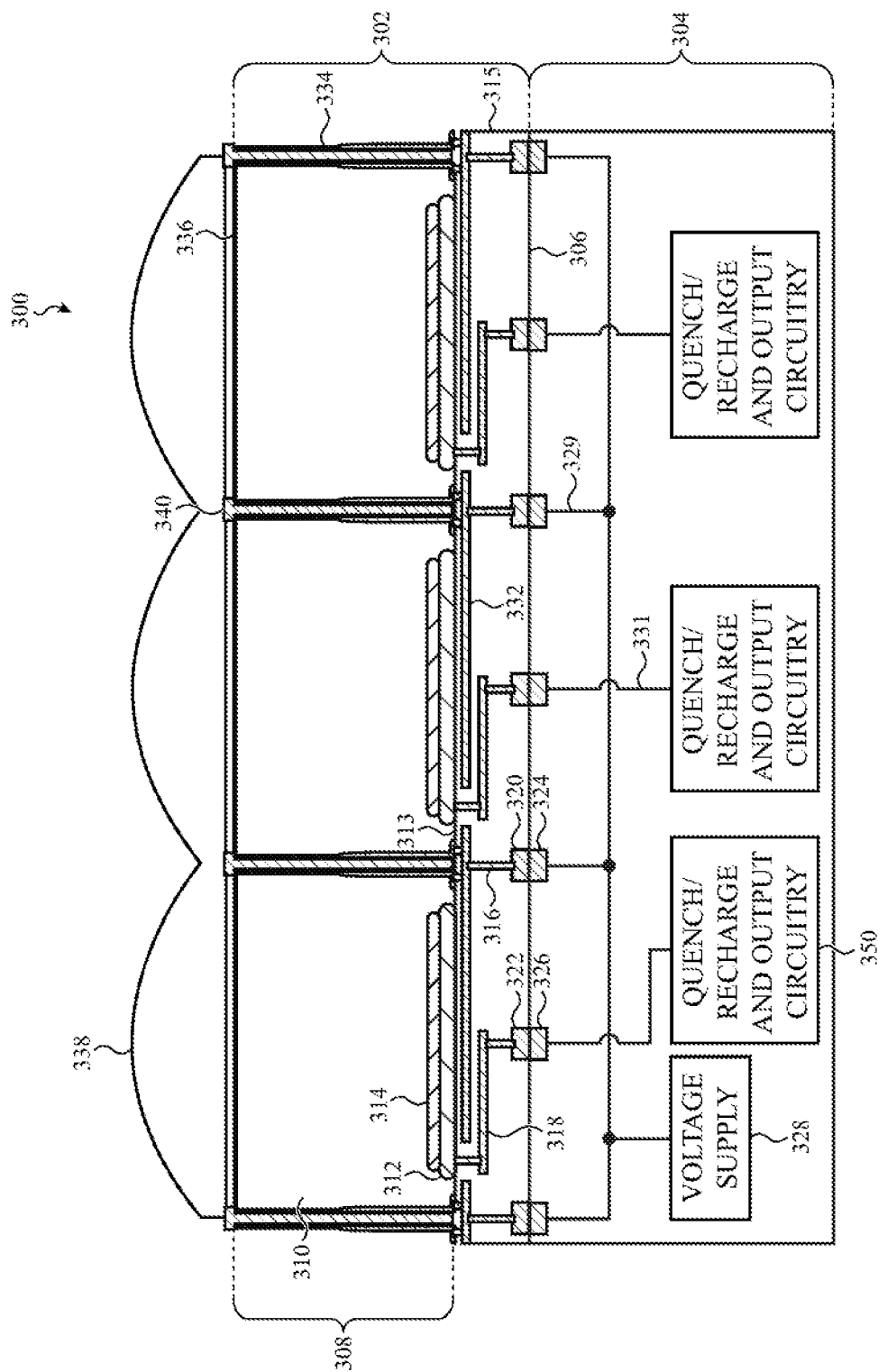
FIG. 3B shows a cross-sectional view of a variation of the example back-illuminated SPAD image sensor of FIG. 3A.

FIG. 3B shows a cross-sectional view of another embodiment based on the example back-illuminated SPAD image sensor of FIG. 3A. A microlens array may be positioned over the back surface 336 of the SPAD image sensor 300. In particular, a microlens 338 can be placed over each SPAD region 308. Each microlens 338 directs light (e.g., photons) toward the center of a respective SPAD region 308. The microlens array may be omitted in other embodiments.

To further reduce or prevent optical crosstalk, an optional light shield 340 may be positioned over the back surface 336 of the sensor wafer 302. In the illustrated embodiment, the light shields 340 are disposed over each DTI region 334. Additionally or alternatively, the light shields 340 can be situated at other locations over the back surface 336 of the sensor wafer 302. Any suitable opaque material can be used to form the light shields 340. One example of an opaque material is a metal, such as tungsten.

In some embodiments, the first dopant type is a p-type dopant (e.g., boron or gallium) and the second dopant type is an n-type dopant (e.g., phosphorus or antimony). In such embodiments, the charge carriers are electrons. In other embodiments, the first dopant type is an n-type dopant and the second dopant type is a p-type dopant. In such embodiments, the charge carriers are holes. In some instances, the PDE and the timing performance of the SPAD regions 308 are better when electrons are the charge carriers because electrons have higher ionization coefficients.

Figure 3C:
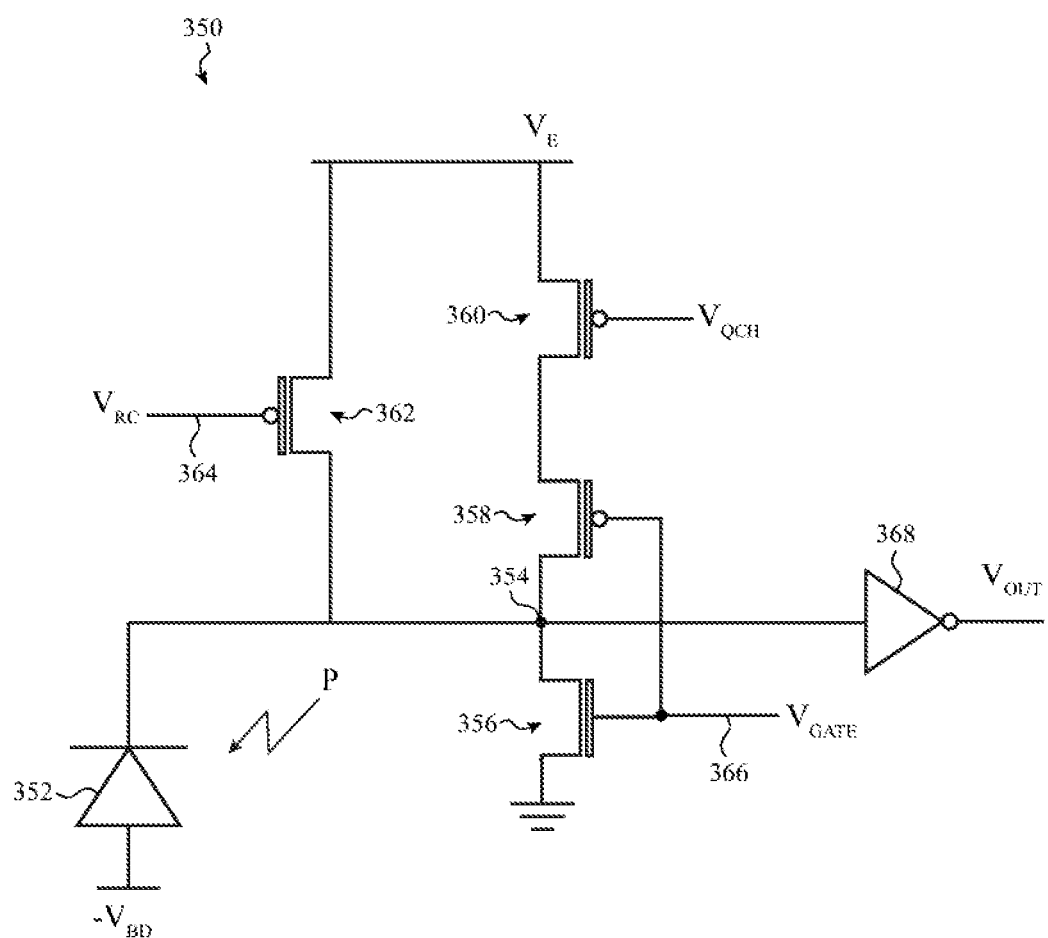
FIG. 3C shows a circuit diagram of an example quench/recharge and output circuit that may be used in the embodiments of FIGS. 3A-B.

FIG. 3C shows a schematic diagram of an example of a circuit that could implement the quench/recharge and output circuitry 350 (hereinafter, just "circuitry 350") in the SPAD regions shown in FIGS. 3A-B. The circuitry 350 allows each SPAD region to be enabled/disabled, recharged, and quenched. An SPAD region 352 is connected between a negative voltage supply, $-V_{BA}$, and a node 354 on the output line on which voltage $V_{OUT}$ is taken. The SPAD 352 has the anode connected to the negative voltage supply $-V_{BA}$ and the cathode connected to the node 354, but other embodiments are not limited to this configuration.

A first terminal of a select transistor 358 and a first terminal of a gating transistor 356 are also connected to the node 354. A second terminal of the gating transistor 356 is connected to a reference voltage (e.g., a ground). A second terminal of the select transistor 358 is connected to a first terminal of a quenching transistor 360. The second terminal of the quenching transistor 360 is connected to a voltage supply $V_E$. The gates of the select transistor 358 and the gating transistor 356 are connected to a common input line 366. The gating signal $V_{GATE}$ is applied to the input line 366 to enable and select the SPAD 352 for light detection, and also to disable and deselect the SPAD 352. Thus, the gating signal $V_{GATE}$ determines the detection period of the SPAD 352. When the SPAD is enabled, avalanche events are detected on output line $V_{OUT}$.

In FIG. 3C, the select transistor 358 and the quenching transistor 360 are depicted as PMOS transistors and the gating transistor 356 is shown as an NMOS transistor. Alternatively, the select transistor 358, the gating transistor 356, and/or the quenching transistor 360 may each be configured as a different type of transistor or circuit.

The quench/recharge and output circuitry 350 also includes a fast recharge transistor 364 connected from the positive supply voltage $V_E$ and the node 354. For the SPAD region shown, fast recharge transistor 364 is a PMOS transistor. The fast recharge transistor 364 is gated by a recharge signal $V_{RC}$. The recharge signal $V_{RC}$ can be synchronized with the gating signal $V_{GATE}$.

The quench/recharge and output circuitry 350 may also include a buffer circuit 368 to amplify the output signal at node 354. The buffer circuit 368 may also perform signal inversion before producing an output voltage $V_{OUT}$.

Figure 4A:
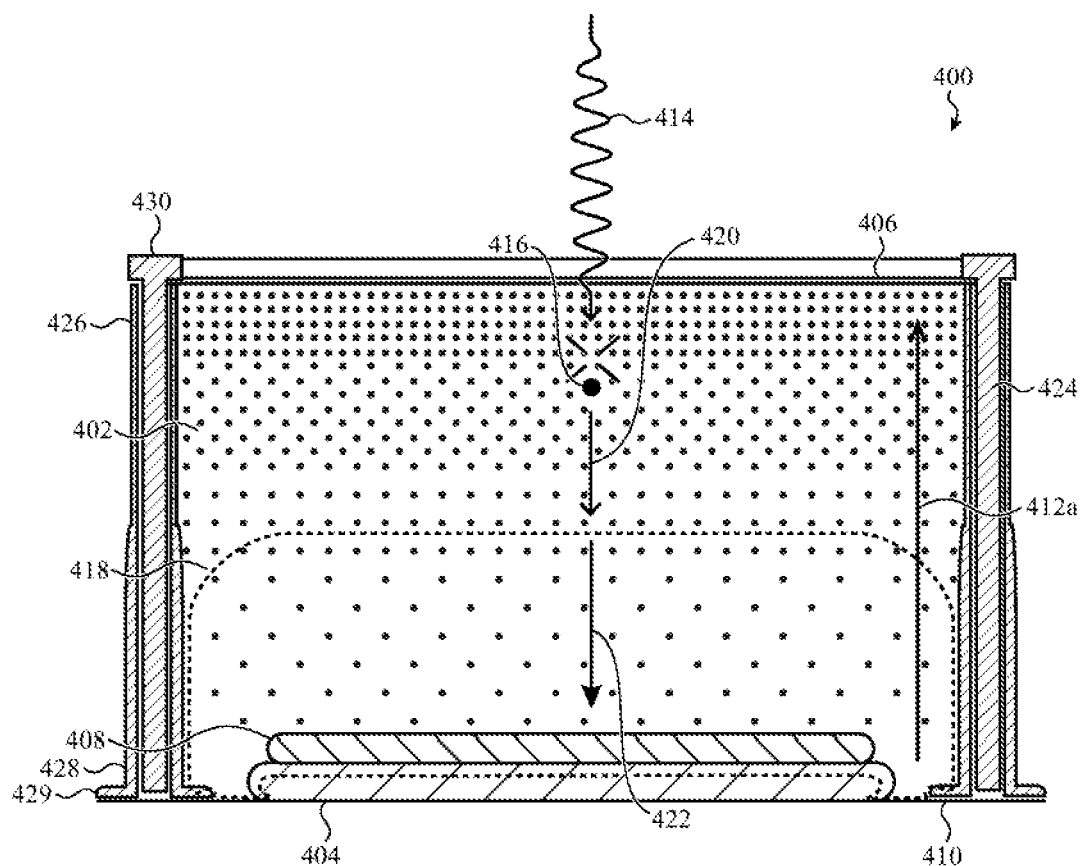
FIG. 4A depicts a first example of an SPAD region that is suitable for use in the SPAD image sensor shown in FIGS. 3A-B.

FIG. 4A depicts one example of an SPAD region that is suitable for use in the SPAD image sensors shown in FIGS. 3A-B. As described earlier, the SPAD region 400 includes an anode region disposed at a back surface 406 and a cathode region 404 disposed at a front surface 410. The anode region comprises an anode gradient layer 402, and an anode avalanche layer 408 that is positioned over the cathode region 404. The anode gradient layer 402 and the anode avalanche layer 408 are doped with one dopant type and the cathode region 404 is doped with a different second dopant type. For example, in one embodiment, the anode gradient layer 402 and the anode avalanche layer 408 are doped with a p-type dopant and the cathode region 404 with an n-type dopant.

As shown in FIG. 4A, the concentration of the dopant in the anode gradient layer 402 increases from the front surface 410 of the anode gradient layer 402 in the SPAD region 400 to the back surface 406 of anode gradient layer 402 in the SPAD region 400 (increase in dopant concentration represented by arrow 412a). Thus, the anode gradient layer 402 includes a dopant concentration gradient (represented by the different dot densities), wherein there is a higher dopant concentration adjacent to the back surface 406 of the sensor wafer, and a lower dopant concentration adjacent to the front surface of the SPAD region. In one embodiment, the doping concentration increases monotonically from the front surface 410 of the anode gradient layer 402 to the back surface 406 of the sensor wafer.

In some embodiments, the doping concentration around the cathode region 404 is sufficient to provide suitable conductivity, while the doping concentration around the anode avalanche layer 408 is higher than the doping concentration around the cathode region 404. This allows the anode gradient layer 402 around the anode avalanche layer 408 to function as a guard ring. A guard ring can reduce the peak of the electric field, which increases the width of the avalanche region. The guard ring may also increase the fill factor of the array of SPAD regions 400 on the sensor wafer (e.g., sensor wafer 302 in FIGS. 3A-B). Embodiments with guard rings directly made are described in relation to FIG. 5 below.

The dopant concentration gradient in the anode gradient layer 402 may reduce the SPAD breakdown voltage and/or shorten the collection time of the minority charge carriers, which can improve the response time of the SPAD region 400. When a photon 414 strikes the SPAD region 400, the dopant concentration gradient guides a photon-generated charge carrier 416 (e.g., an electron) through the anode gradient layer 402 through the depletion layer 418 (guidance represented by arrow 420) discussed further below and then to the anode avalanche layer 408 (guidance represented by arrow 422).

As described earlier, DTI regions 424 are positioned between adjacent or neighboring SPAD regions 400. The DTI regions 424 are configured to suppress optical crosstalk and reduce or prevent electrical crosstalk. Each DTI region 424 extends from the front surface 410 of the anode gradient layer 402 (e.g., from the cathode region 404) to, and through, the back surface 406 of the sensor wafer (e.g., sensor wafer 302 in FIGS. 3A-B). In some embodiments, a layer 426 is positioned over the exterior surface of the DTI regions 424. The layer 426 may be a pinning and/or passivation layer that is doped with the same dopant type as the anode gradient layer 402. As described earlier, the pinning layer provides an electrical connection between the back surface 406 and the first connector 316 (FIGS. 3A-B).

Additionally, in some embodiments, a diffusion region 429 and a doped well 428 that are doped with the same dopant type as the anode gradient layer 402 may be positioned along the front surface 410 of the anode gradient layer 402. The diffusion region 429 and the doped well 428 can provide an electrical connection to the SPAD region 400. The first connector 316 can connect to the doped well 428 via the diffusion region 429, which permits the voltage supply 328 (FIGS. 3A-B) to apply a bias voltage to the pinning layer (e.g., layer 426). The doped well 428 may be omitted in other embodiments, although the portions of the doped well 428 below the electrical contacts may remain.

As the anode region as a whole contacts the cathode region 404, a p-n junction is formed. The anode avalanche layer 408 and the cathode region 404 may be doped so that with no reverse bias applied between the back surface 406 and the front surface 410, the depletion region is contained within just the anode avalanche layer 408 and surrounds the cathode region 404. When reverse bias is applied, the depletion layer 418 can expand into the anode gradient layer 402 as shown in FIG. 4A. The anode avalanche layer 408 is doped highly enough so that when reverse bias is applied, self-sustaining avalanche pulses can be created from charge carriers. The avalanche pulses are self-sustained until quenched by altering the reverse bias voltage. Further, anode avalanche layer 408 can concurrently be doped low enough (i.e., not doped too highly) so that it is depleted under reverse bias.

As discussed earlier, a light shield 430 can be positioned over the back surface 406 of the sensor wafer. Each light shield 430 may be disposed over the DTI regions 424 to reduce or prevent incoming photons from propagating into an adjacent or neighboring SPAD region 400.

Figure 4B:
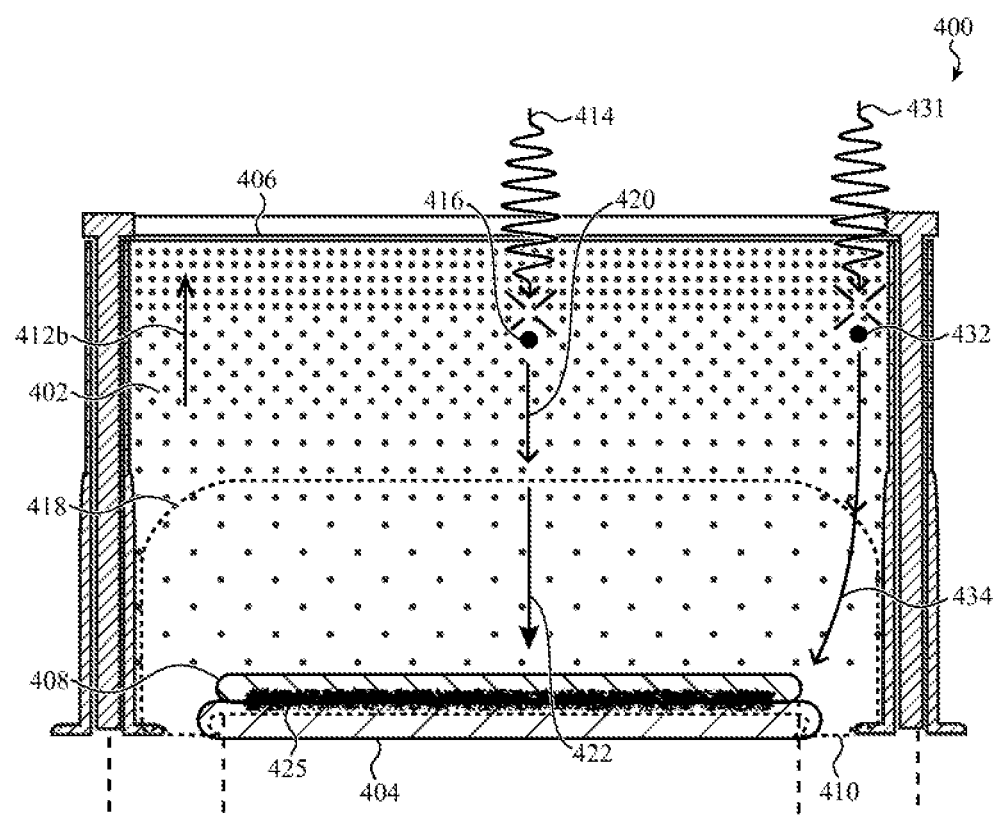
FIG. 4B depicts further details of the example SPAD region of FIG. 4A.

FIG. 4B shows more detail of the SPAD region of FIG. 4A, in particular, how the sizes of the cathode region 404 and the anode avalanche layer 408 can affect photon detection efficiency. In FIG. 4B, the dopant gradient increases in the direction represented by the arrow 412b. As described above, the photon 414 generates a charge carrier 416, which moves by the applied reverse bias voltage to the anode avalanche layer 408 and enters the avalanche region 425 at the junction with cathode region 404.

In the illustrated embodiment, the lateral length and the lateral width of the anode avalanche layer 408 are less than the lateral length and the lateral width of the cathode region 404. Thus, the area of the cathode region 404 is greater than the area of the anode avalanche layer 408. Unwanted breakdown between the cathode region 404 and the anode gradient layer 402 adjacent to the cathode region 404 is reduced or eliminated when the area of the anode avalanche layer 408 is smaller than the area of the cathode region 404.

However, reducing the unwanted breakdown can limit the maximum size of the avalanche region 425. In general, the maximum size of the avalanche region 425 is governed by the areas of the anode avalanche layer 408 and the cathode region 404, and the maximum avalanche region 425 occurs when the areas of the cathode region 404 and the anode avalanche layer 408 are the same. When the area of the anode avalanche layer 408 is less than the area of the cathode region 404, the actual area of the avalanche region 425 is less than the maximum size. Thus, in some situations, a photon-generated charge carrier 432 that is created when a photon 431 strikes near a side edge of the SPAD region 400 may not be guided by the dopant concentration gradient to the avalanche region 425. Instead, the photon-generated charge carrier 432 may drift and be collected through an edge of the cathode region 404 (drift represented by arrow 434). However, the electric fields around the edges of the cathode region 404 are usually weaker, which means the photon-generated charge carrier 432 does not trigger an avalanche. The SPAD region 400 does not detect the photon-generated charge carrier 432 when an avalanche is not triggered.

Figure 4C:
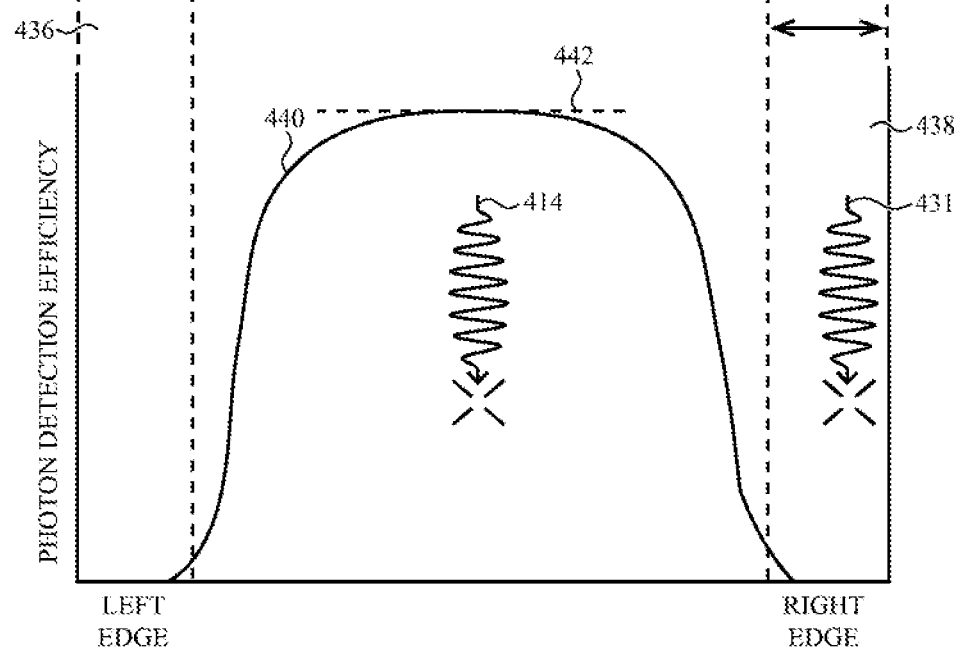
FIG. 4C is a representative plot of the photon detection efficiency across the SPAD region shown in FIG. 4B.

FIG. 4C is a representative plot of the photon detection efficiency across the SPAD region shown in FIG. 4B. The plot 440 extends from the left side edge of the SPAD region 400 to the right side edge of the SPAD region 400. The plot 440 indicates the PDE is at a peak PDE value 442 across most of the avalanche region 425 and drops off or decreases near the edges of the avalanche region 425. Thus, in the illustrated embodiment, the photon 414 has a high PDE because the photon-generated charge carrier 416 is guided to or near the center of the avalanche region 425, which is associated with the peak PDE value 442.

However, the PDE of the photon 431 is low or zero because the associated photon-generated charge carrier 432 is not guided to the avalanche region 425 and does not trigger an avalanche. For that reason, the areas 436 and 438 in the SPAD region 400 can be considered dead zones. A dead zone is an area where a charge carrier generated in that area may not be detected by the SPAD region because the photon-generated charge carrier did not trigger an avalanche.

Figure 4D:
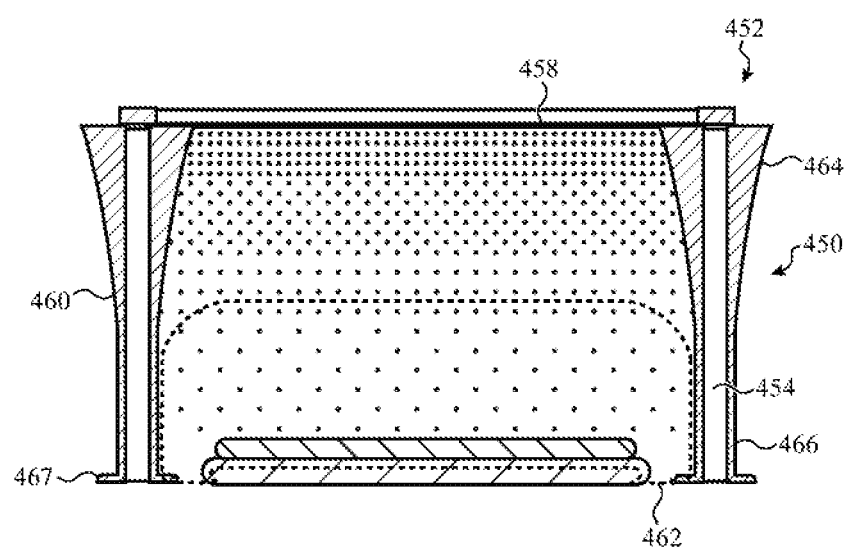
FIG. 4D depicts a second example of an SPAD region with deep trench isolation regions that is suitable for use in the SPAD image sensor shown in FIGS. 3A-B.

The deep trench isolation (DTI) regions 424 of FIG. 4A can be constructed in various implementations. FIG. 4D shows a cross section of one example of a DTI region for the SPAD region 452. There may be as DTI region, such as DTI region 450, on each of the lateral sides of the SPAD region 452 to isolate it from the other SPAD regions in the sensor wafer. The DTI region 450 may include one or more vias, such as via 454, that extend from the front surface 462 of the SPAD region 452 to the back surface 458 of the sensor wafer (e.g., sensor wafer 302 in FIGS. 3A-B). In some embodiments, the via 454 extends through the back surface 458 to improve the isolation of the SPAD region 452 from neighboring SPAD regions. The vias may be used for electrical connection of the reverse bias voltage applied to the p-n junction of the SPAD region 452.

In the embodiment of FIG. 4D, the DTI region 450 is filled with an insulating material, such as silicon dioxide. A pinning layer 460 is situated over the exterior surfaces of the DTI regions 450. The pinning layer 460 extends from the front surface 462 of the SPAD region 452 to the back surface 458 of the sensor wafer. The pinning layer 460 may include a flared region 464 that extends toward the back surface 458. The pinning layer may occur as a result of a dedicated implant process being performed from the front surface 462.

Additionally, as described earlier, a diffusion region 467 and a doped well 466 may be positioned along the front surface of the SPAD region 452 and connected to the pinning layer 460. The diffusion region 467 and the doped well 466 can provide an electrical connection to the front surface 510 of the SPAD region 452. The first connector 316 (FIGS. 3A-B) can connect to the doped well 466 via the diffusion region 467, which permits a voltage supply (e.g., voltage supply 328 in FIGS. 3A-B) to apply an isolation voltage to the pinning layer 460.

In a second set of embodiments, the DTI regions may include a conductive material. An isolation voltage may then be applied to the conductive material to induce the pinning layer within the semiconductor region of the SPAD. The connections to the conductive material may made through a via.

In a third set of embodiments, the DTI regions may include polysilicon. In a fourth set of embodiments, the DTI regions may include multiple films or layers of low and high refractive index materials. For example, in one embodiment, the layers of the low and the high refractive index materials are arranged as alternating layers of a low refractive index material and a high refractive index material. Example configurations of the layers include, but are not limited to, three alternating layers of silicon oxide (SiOx) and silicon nitride (SiN), or three alternating layers of silicon oxide and silicon. Further example configurations of the layers inside have low-high-low-high-low refractive indices. One such example is configured as SiOx/SiN/SiOx/SiN/SiOx. A variation of this example substitutes just silicon for the SiOx.

Figure 5:
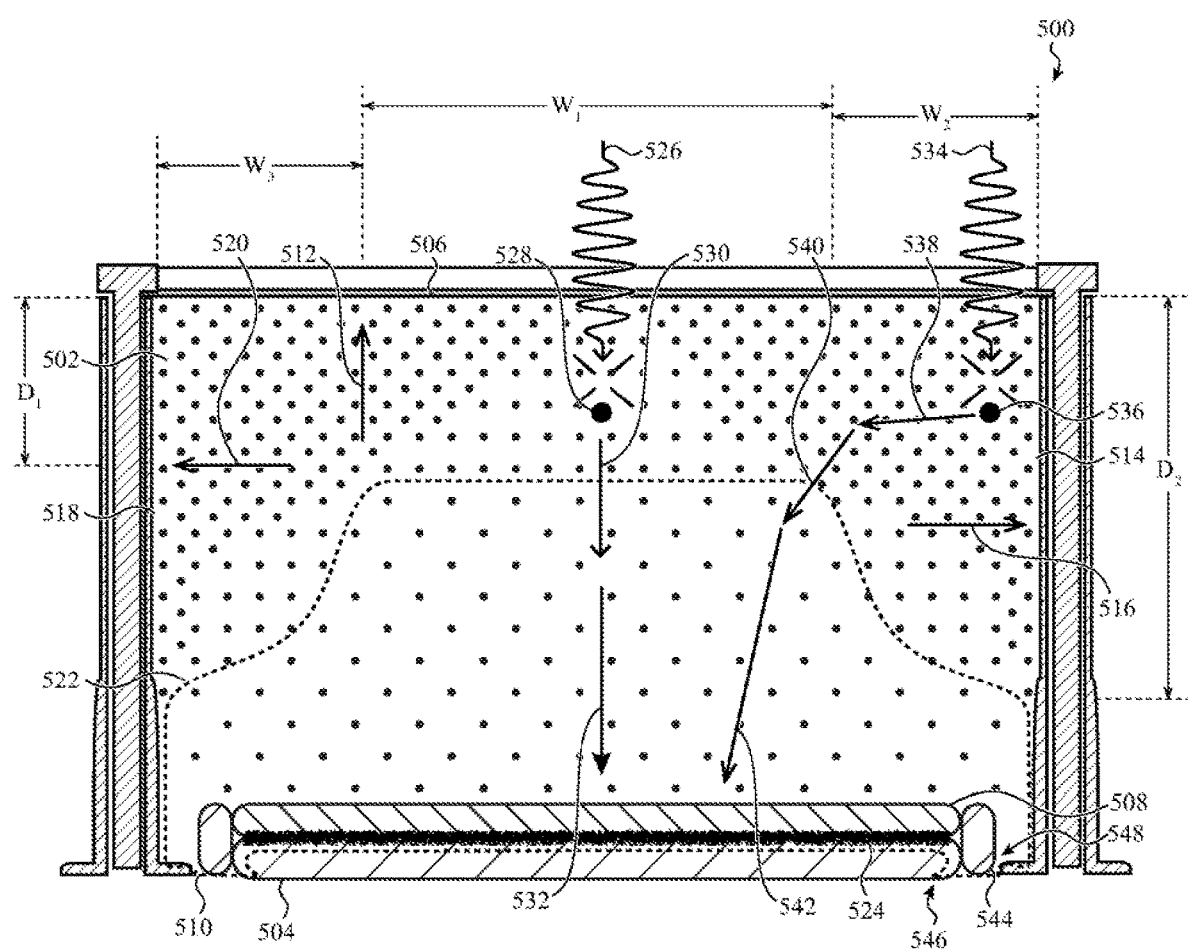
FIG. 5 shows a third example of an SPAD region with a guard rings layer that is suitable for use in the SPAD image sensor shown in FIGS. 3A-B.

FIG. 5 shows another example of a SPAD region that is suitable for use in the SPAD image sensor shown in FIGS. 3A-B. The SPAD region 500 includes an anode region, and a cathode region 504 that is located adjacent to the front surface 510 of the SPAD region 500. The anode region includes an anode gradient layer 502, and an anode avalanche layer 508 that is positioned over the cathode region 504. The anode gradient layer 502 and the anode avalanche layer 508 are doped with one dopant type and the cathode region 504 is doped with a different second dopant type. For example, in one embodiment, the anode gradient layer 502 and the anode avalanche layer 508 are doped with a p-type dopant and the cathode region 504 with an n-type dopant. Together the anode gradient layer 502 and the anode avalanche layer 508 form the anode section of a diode structure of the SPAD region 500 that is reversed biased for light detection.

The anode gradient layer 502 includes multiple dopant concentration gradients. A back edge dopant concentration gradient extends vertically from the more lightly doped layer 522 to the back surface 506 of the anode gradient layer 502. In the illustrated embodiment, the back edge dopant concentration of the dopants increases from the center region of the more lightly doped layer 522 to the back surface 506 of the anode gradient layer 502 (increase in dopant concentration represented by arrow 512). The dopant concentration is highest at and near the back surface 506 of the anode gradient layer 502. In the embodiment shown in FIG. 5, the area in the anode gradient layer 502 that includes the back edge dopant concentration gradient is defined by the depth D1 and the width W1. In other embodiments, the area of the back edge dopant concentration gradient can differ from the illustrated back edge dopant concentration gradient.

Additionally, there is a horizontal concentration of the dopants in the anode gradient layer 502 that increases from the interior of the anode gradient layer 502 to the right side edge 514 of the anode gradient layer 502 to produce a first side edge dopant concentration gradient (increase in dopant concentration represented by arrow 516). The first side edge dopant concentration gradient is transverse (e.g., perpendicular or at a diagonal) to the back edge dopant concentration gradient. The dopant concentration in the first side edge dopant concentration gradient is highest at and near the right side edge 514 of the anode gradient layer 502.

In the illustrated embodiment, the area in the anode gradient layer 502 that includes the first side edge dopant concentration gradient is defined by the width W2 and the contoured edge of the more lightly doped layer 522 (having a deepest depth of D2 adjacent to the right side edge 514). In some embodiments, the width W2 is larger than the width between the avalanche region 524 and the right side edge 514 of the anode gradient layer 502. In other embodiments, the area of the first side edge dopant concentration gradient can differ from the illustrated first side edge dopant concentration gradient.

Similarly, the concentration of the dopants in the anode gradient layer 502 increases from the interior of the anode gradient layer 502 to the left side edge 518 to produce a second side edge dopant concentration gradient (increase in dopant concentration represented by arrow 520). The second side edge dopant concentration gradient is also transverse to the back edge dopant concentration gradient. The dopant concentration in the second side edge dopant concentration gradient is highest at and near the left side edge 518 of the anode gradient layer 502.

In the illustrated embodiment, the area in the anode gradient layer 502 that includes the second side edge dopant concentration gradient is defined by the width W3 and the contoured edge of the more lightly doped layer 522 (having a deepest depth of D2 adjacent to the right side edge 514). In the embodiment shown in FIG. 5, W2 substantially equals W3, although this is not required. In some embodiments, the width W3 is larger than the width between the avalanche region 524 and the left side edge 518 of the anode gradient layer 502. In other embodiments, the area of the second side edge dopant concentration gradient can differ from the illustrated second side edge dopant concentration gradient.

In some instances, to avoid edge breakdown, the first and the second side edge dopant concentration gradients do not extend to (e.g., contact) the back surface of the sensor wafer (e.g., sensor wafer 302 in FIGS. 3A-B). In one non-limiting example, the first and the second edge dopant concentration gradients are separated from the back surface of the sensor wafer by distances that are greater than one micron.

Any suitable fabrication method can be used to form the first and the second side edge dopant concentration gradients. For example, in one embodiment, ions are implanted in the areas that will include the first and the second edge dopant concentration gradients. The implanted ions are then thermally diffused to create the first and the second edge dopant concentration gradients. In another example, after the thermal diffusion from the complementary metal-oxide-semiconductor front-end-of-line high temperature process, a lateral gradient doping process can be performed when a highly doped polysilicon material is being formed in the DTI regions (e.g., DTI regions 334 in FIGS. 3A-B). In some embodiments, the highly doped polysilicon material is doped with a p-type dopant.

When the SPAD is reverse biased, the depletion region can be extended from within the anode avalanche region 508 into the more lightly doped layer 522, and may include all or most of the more lightly doped layer 522. The result can be that the area of the extended depletion region is greater than the area of the depletion layer 418 in FIG. 4A. The more lightly doped layer 522 in FIG. 5 is lightly or low doped to increase the depth and the width of the depletion region. The expansion of the depletion region to include all or most of the more lightly doped layer 522 can reduce the overall propagation time of the photon-generated charge carriers through the more lightly doped layer 522. The propagation time is the time from incidence of a photon that generates a charge carrier until the avalanche current is produced. As examples, the charge carriers induced by entering photons 526 and 534 more quickly enter the extended depletion region and more quickly enter the avalanche region 524. Additionally, the extended depth and width of the depletion region decreases the junction capacitance.

The edge of the more lightly doped layer 522 can be contoured or shaped by the density profiles or areas of the back edge, the first side edge, and the second side edge dopant concentration gradients. In the illustrated embodiment, the areas of the first and the second side edge dopant concentration gradients in the anode gradient layer 502 cause the outer edges of the more lightly doped layer 522 to extend downward towards the avalanche region 524. The depletion region may be shaped differently in other embodiments.

The first back edge dopant concentration gradient is configured to guide photon-generated charge carriers to the avalanche region 524. For example, when a photon 526 strikes the anode gradient layer 502, the back edge dopant concentration gradient guides the photon-generated charge carrier 528 to the depletion region (guidance represented by arrow 530). Once in the depletion region, the photon-generated charge carrier 528 propagates to the avalanche region 524 (represented by arrow 532).

The first and the second side edge dopant concentration gradients guide a photon-generated charge carrier (e.g., photon-generated charge carrier 536) from a side edge of the anode gradient layer 502 towards or into the interior of the anode gradient layer 502 (e.g., to the center of the anode gradient layer 502). In other words, the first and the second side edge dopant concentration gradients guide a photon-generated charge carrier away from the dead zones (e.g., dead zones 436, 438 in FIG. 4B) to an area in the anode gradient layer 502 that permits the photon-generated charge carrier to be directed to the avalanche region 524. In some embodiments, the first and the second side edge dopant concentration gradients may also guide a photon-generated charge carrier from the interior of the anode gradient layer 502 to the more lightly doped layer 522. Alternatively, in other embodiments, the combination of the back edge dopant concentration gradient and one of the side edge dopant concentration gradients can guide a photon-generated charge carrier from the interior of the anode gradient layer 502 to the more lightly doped layer 522. In some situations, the back edge dopant concentration gradient guides a photon-generated charge carrier from the interior of the anode gradient layer 502 to the more lightly doped layer 522. Once in the depletion region, the photon-generated charge carrier propagates to the avalanche region 524.

For example, when a photon 534 strikes near the left side edge of the anode gradient layer 502, the first side edge dopant concentration gradient guides the photon-generated charge carrier 536 into or towards the interior of the anode gradient layer 502 (guidance represented by arrow 538). The photon-generated charge carrier 536 is then guided to the depletion region (guidance represented by arrow 540). Once in the depletion region, the photon-generated charge carrier 536 propagates to the avalanche region 524 (represented by arrow 542).

A guard ring layer 544 is positioned adjacent or next to the avalanche region 524. The guard ring layer 544 is doped with the second dopant type (the same dopant type as the cathode region 504). In particular, the guard ring layer 544 has a dopant concentration that is less than the cathode region 504. The guard ring layer 544 modifies the electric field distribution between the cathode region 504 and the anode gradient layer 502 adjacent to the avalanche region 524.

Figure 6:
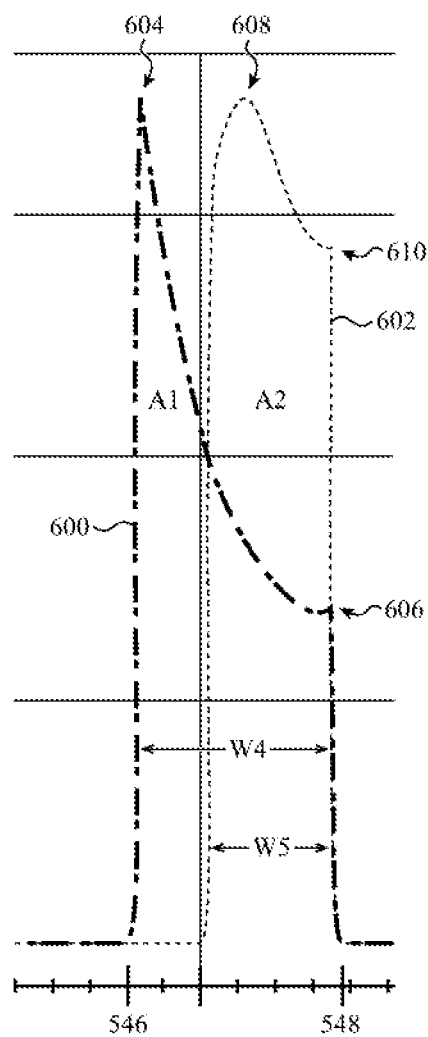
FIG. 6 depicts example plots of the electric fields around the edge of the avalanche region in the example of FIG. 5 with and without the guard ring layer.

FIG. 6 depicts example plots of the electric fields around the edge of the avalanche region 524 with and without the guard ring layer 544. The plots 600, 602 depict the electric fields between the edge of the cathode region 504 (area 546 in FIG. 5) and the adjacent anode gradient layer 502 (area 548 in FIG. 5). Plot 600 represents the electric field when the guard ring layer 544 is absent. The area under the curve of plot 600 designated as A1 is essentially proportional to the voltage that the junction in the edge of the cathode region 504 can support without suffering from edge breakdown. The width between the edge of the cathode region 504 and the edge of the anode gradient layer 502 is designated as W4 in FIG. 6 when the guard ring layer 544 is absent. As can be seen in plot 600, the electric field rises quickly and peaks 604 near the edge of the avalanche region (e.g., avalanche region 425 in FIG. 4B).

Moreover, the peak 604 in the electric field then declines steeply in the direction towards the area 548 (e.g., to point 606). This steep reduction means the distribution of electric fields around the edges of the avalanche region is not efficiently optimized to minimize W4 while maintaining the peak 604 lower than a critical threshold for impact ionization with a constant A1.

Plot 602 illustrates the electric field when the guard ring layer 544 is adjacent to the avalanche region 524. The area under the curve of plot 602 is designated as A2 while the width between the edge of the cathode region 504 and the edge of the anode gradient layer 502 is designated as W5 in FIG. 6 when the guard ring layer 544 is present. The guard ring layer 544 maintains the peak of the electric field at the edges of the avalanche region 524 (e.g., at area 546) lower than the critical threshold for impact ionization, similar to the case when the guard ring layer 544 is absent. However, when the guard ring layer 544 is present, W5 is smaller than W4 for an A2 that is substantially the same as A1. As a result, the area of the avalanche region 524 when the guard ring layer 544 is present is larger than the area of the avalanche region 425 when the guard ring layer 544 is absent. Therefore, the introduction of guard ring layer 544 permits the areas (L×W) of the cathode region 504 and the anode avalanche layer 508 to be substantially equal while preventing edge breakdown, which in turn improves the photon detection efficiency.

Different doping levels can be chosen for the anode avalanche layer, the anode gradient layer, and the cathode region to achieve different performance characteristics. For example, the side gradient doping characteristics discussed in conjunction with FIG. 5 serve at least to increase PDE by guiding charge carriers into the avalanche region at the junction of the anode avalanche layer and the cathode region. Doping the anode gradient layer to have a guard ring layer increases the avalanche region.

Another set of embodiments has doping levels for the anode avalanche layer and the cathode region based on the how the anode avalanche layer is to be depleted in relation to the breakdown voltage at the junction. This set of embodiments can be used in any of the embodiments of this disclosure, including the embodiments discussed in conjunction FIGS. 4A-C and FIG. 5. In these embodiments the anode avalanche layer, such as anode avalanche layers 408 and 508, can be doped so that it is depleted by a reverse bias voltage before the breakdown voltage is reached. Further, when a low doped region is also used above the anode avalanche layer, such as anode gradient layers 402 or more lightly doped layer 522, the low doped region will also be depleted for only small increases in the reverse bias voltage with respect to the reverse bias voltage that depleted the anode avalanche layer. One performance characteristic of such embodiments is fast propagation time for the charge carriers. Another performance characteristic is that, since a SPAD region may be disabled from detecting light by setting the applied reverse bias to be at or just before the breakdown voltage, smaller changes in reverse bias can used to enable/disable the SPAD region from detecting light.

As all the embodiments disclosed above provide a fast propagation time for the charge carriers, these embodiments can be used with fast gating circuitry, such as the gating circuit of FIG. 3C for fast sensing. In some applications, the SPAD image sensors are used as part of a light distance and ranging (LIDAR) system within an electronic device. For example, a smartphone may use a LIDAR with a SPAD image sensor as part of an autofocus subsystem in a camera. Such systems can work by emitting a sequence of brief light pulses (e.g., 2 nsec pulses from a laser) and detecting reflected light from the pulses at the SPAD image sensor. Distances to an object are determined from a time-of-flight: the time from emission to detection. Since the emitted light pulses are produced on or near the SPAD image sensor, the SPAD regions themselves must be disabled from detecting light during pulse emission to prevent unwanted light (e.g., scattered light, or reflections of the emitted pulse from a device cover glass) from being received, and possibly saturating the SPAD regions.

A fast gating circuit, such as shown in FIG. 3C, can quickly bring the SPAD into its avalanche bias region. Such fast gating, however, can introduce two issues. First, if a photon enters the SPAD and generates a charge carrier before the gating circuit enables the SPAD, and if the charge carrier propagation time is too slow, the charge carrier may enter the avalanche region after the fast gating circuit enables the SPAD. This may produce a false reception signal during the time the SPAD is enabled. Second, if charge carrier is produced while the SPAD is enabled and if the charge carrier propagation time is too slow, the fast gating circuit may quench the SPAD's bias into the avalanche region before the charge carrier arrives in the avalanche region, and so a desired signal from the charge carrier may not be produced. The side gradient layers also improve the propagation time by guiding the charge carriers to the center region of the SPAD. The embodiments described above have fast propagation times, and so reduce or avoid such issues.

Figure 7:
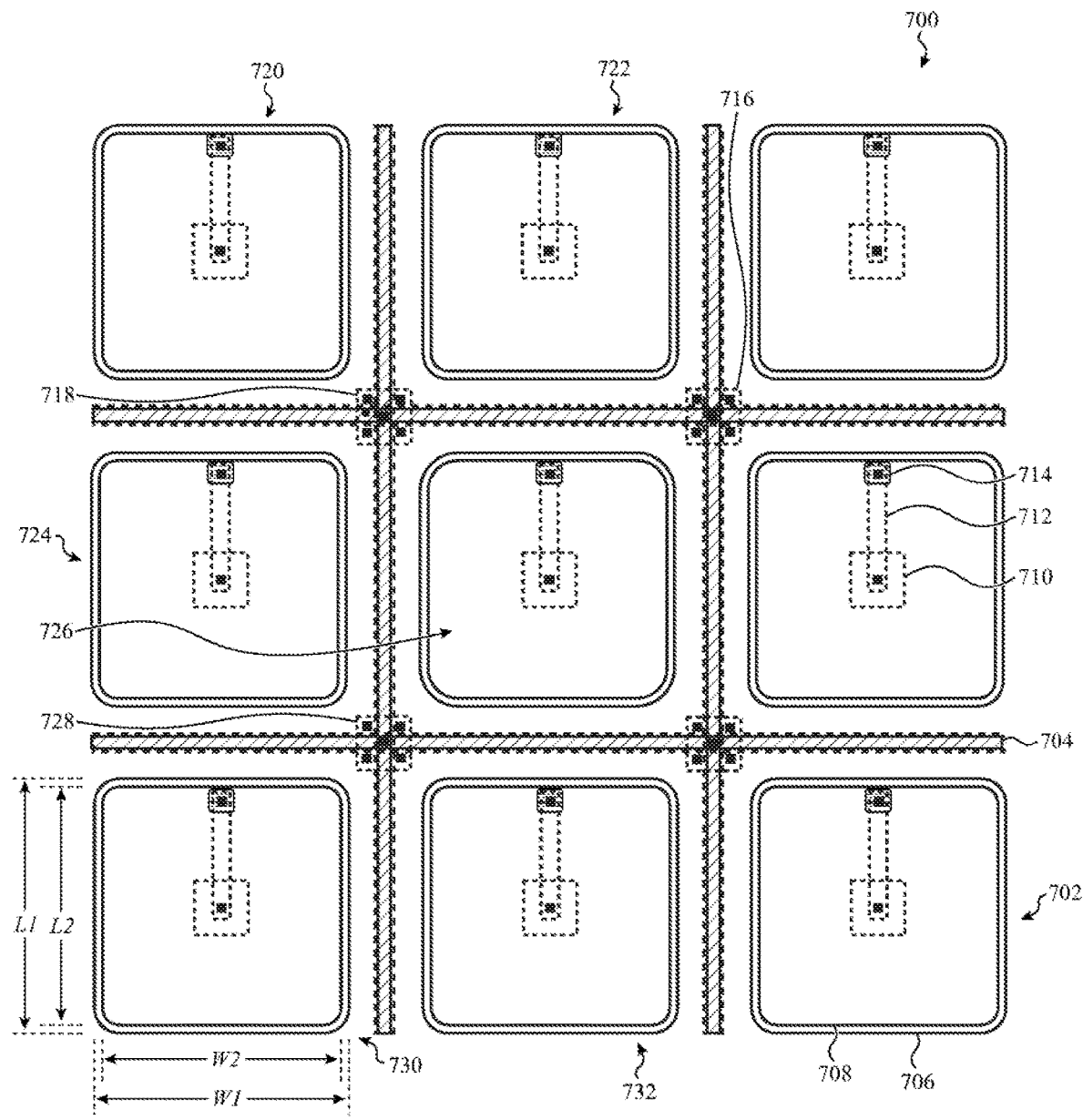
FIG. 7 shows an example layout for an array of SPAD regions in a sensor wafer.

FIG. 7 shows an example layout for an array of SPAD regions in a sensor layer. Although the array 700 is depicted with nine SPAD regions 702, other embodiments can include any number of SPAD regions 702. Positioned between and around the SPAD regions 702 are the DTI regions 704. As described earlier, each SPAD region 702 includes a cathode region 706 and an anode region 708. The cathode region 706 has a first lateral width W1 and a first lateral length L1, while the anode region 708 has a second lateral width W2 and a second lateral length L2. In some embodiments, W2 is less than W1 and L2 is less than L1 such that the area of the anode region 708 is less than the area of the cathode region 706. Edge breakdown is reduced or prevented when the area of the anode region 708 is less than the area of the cathode region 706.

Edge breakdown is further reduced or prevented by avoiding sharp angles in the corners of the anode region 708 and the cathode region 706. Preferably, the layout of the anode region 708 and that of the cathode region 706 exhibits round corners characterized by a radius that is large enough to prevent an undesirable increase in the local electric field due to the effects of radius of curvature.

A first contact pad 710 (shown in phantom) is positioned below the cathode region 706. A first connector 712 (shown in phantom) connects the first contact pad 710 to the cathode region 706 at location 714. The first contact pad 710 and the first connector 712 are similar to the second contact pad 322 and the second connector 318 in FIGS. 3A-B. Although the first contact pad 710 is depicted as being positioned below the center of the cathode region 706, this is not required. The first contact pads 710 may be situated at any suitable location inside the SPAD active areas.

A second contact pad 716 is positioned at the intersections of the DTI regions 704 and is connected to another connector (e.g., first connector 316 in FIGS. 3A-B). Each second contact pad 716 can be a contact pad for the anode region 708 of the four SPAD regions 702 that abut or share that second contact pad 716. Alternatively, each second contact pad 716 may be a contact to the DTI regions 704, the pinning layers, and/or the diffusion regions of the four SPAD regions 702 that share a second contact pad 716. The second contact pad 716 connects to a second connector (e.g., first connector 316 in FIGS. 3A-B) that is operably connected to a voltage supply (e.g., voltage supply 328 in FIGS. 3A-B).

In some embodiments, the function of the second contact pads 716 that are arranged along one dimension (e.g., along a row or a column) can alternate across the array 700. For example, the second contact pad 718 can provide the high voltage for the four SPAD regions 720, 722, 724, 726 that abut or share the second contact pad 718. As described earlier, the high voltage reverse biases the p-n junctions in the SPAD regions 702. In the illustrated embodiment, all of the second contact pads that are aligned horizontally with the second contact pad 718 can perform the same function (e.g., provide the high voltage for the SPAD regions).

The second contact pad 728 can provide the bias voltage for the DTI regions 704, the pinning layers, and/or the doped wells associated with the four SPAD regions 724, 726, 730, 732 that abut or share the second contact pad 728. In the illustrated embodiment, all of the second contact pads 716 that are aligned horizontally with the second contact pad 728 can perform the same function (e.g., provide the bias voltage for the DTI regions 704, the pinning layers, the diffusion regions, and/or the doped wells).

FIG. 8 depicts a block diagram of an electronic device that includes one or more back-illuminated SPAD image sensors. The electronic device 800 includes one or more back-illuminated SPAD image sensors 802, one or more processing devices 804, memory 806, one or more network interfaces 808, and a power source 810, each of which will be discussed in turn below.

The one or more SPAD image sensors 802 can be configured as shown in FIGS. 2-7. The one or more processing devices 804 can control some or all of the operations of the electronic device 800. The processing device(s) 804 can communicate, either directly or indirectly, with substantially all of the components of the electronic device 800. For example, one or more system buses 812 or other communication mechanisms can provide communication between the SPAD image sensor(s) 802, the processing device(s) 804, the memory 806, the network interface 808, and/or the power source 810. In some embodiments, the processing device(s) 804 can be configured to receive output signals from the SPAD image sensor(s) 802 and perform a time-of-flight determination. The processing device(s) 804 can be implemented as any electronic device capable of processing, receiving, or transmitting data or instructions. For example, the one or more processing devices 804 can be a microprocessor, a central processing unit (CPU), an application-specific integrated circuit (ASIC), a digital signal processor (DSP), or combinations of multiple such devices. As described herein, the term "processor" is meant to encompass a single processor or processing unit, multiple processors, multiple processing units, or other suitably configured computing element or elements.

The memory 806 can store electronic data that can be used by the electronic device 800. For example, the memory 806 can store electrical data or content such as, for example, audio files, document files, timing and control signals, time-of-flight calculations, photon counts, photon arrival times, and so on. The memory 806 can be configured as any type of memory. By way of example only, memory 806 can be implemented as random access memory, read-only memory, Flash memory, removable memory, or other types of storage elements, in any combination.

The network interface 808 can receive data from a user or one or more other electronic devices. Additionally, the network interface 808 can facilitate transmission of data to a user or to other electronic devices. The network interface 808 can receive data from a network or send and transmit electronic signals via a wireless or wired connection. For example, time-of-flight data and/or photon counts that are determined by the processing device(s) 804 can be transmitted to another electronic device.

Examples of wireless and wired connections include, but are not limited to, cellular, Wi-Fi, Bluetooth, and Ethernet. In one or more embodiments, the network interface 808 supports multiple network or communication mechanisms. For example, the network interface 808 can pair with another device over a Bluetooth network to transfer signals to the other device while simultaneously receiving signals from a Wi-Fi or other wired or wireless connection.

The one or more power sources 810 can be implemented with any device capable of providing energy to the electronic device 800. For example, the power source 810 can be a battery. Additionally or alternatively, the power source 810 can be a wall outlet that the electronic device 800 connects to with a power cord. Additionally or alternatively, the power source 810 can be another electronic device that the electronic device 800 connects to via a wireless or wired connection (e.g., a connection cable), such as a Universal Serial Bus (USB) cable.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A back-illuminated single-photon avalanche diode (SPAD), comprising:
    a sensor wafer having a back surface opposite a front surface, the sensor wafer comprising:
        a SPAD region configured to receive photons of light entering through the back surface of the sensor wafer, the SPAD region including,
            an anode region including an anode gradient layer; and
            a cathode region adjacent the front surface of the sensor wafer;
        a deep trench isolation (DTI) region surrounding the SPAD region and extending from the front surface to the back surface of the sensor wafer; and
        a passivation layer extending between the DTI region and the SPAD region, the passivation layer having a same doping as the anode gradient layer.

2. The back-illuminated SPAD of claim 1, further comprising:
    a light shield disposed on the back surface of the sensor wafer, over the DTI region.

3. The back-illuminated SPAD of claim 1, further comprising:
    a light reflector disposed adjacent the front surface of the sensor wafer, under at least a portion of the SPAD region, and configured to reflect photons of light that have passed through the SPAD region back toward the SPAD region.

4. The back-illuminated SPAD of claim 1, further comprising:
    a lateral shield disposed adjacent the front surface of the sensor wafer, under at least a portion of the SPAD region, and configured to reflect photons of light exiting the SPAD region back toward the SPAD region; and
    a contact disposed on the front surface of the sensor wafer, the contact electrically connected to the passivation layer and the lateral shield.

5. The back-illuminated SPAD of claim 1, wherein the DTI region comprises:
    a via; and
    alternating layers of a low refractive index material and a high refractive index material.

6. The back-illuminated SPAD of claim 1, further comprising:
a circuit wafer stacked with and attached to the front surface of the sensor wafer.

7. A back-illuminated single-photon avalanche diode (SPAD), comprising:
a sensor wafer having a back surface opposite a front surface, the sensor wafer comprising:
a SPAD region configured to receive photons of light entering through the back surface of the sensor wafer;
a deep trench isolation (DTI) region surrounding the SPAD region and extending from the front surface to the back surface of the sensor wafer;
a lateral shield disposed adjacent the front surface of the sensor wafer, under at least a portion of the SPAD region, and configured to reflect photons of light exiting the SPAD region back toward the SPAD region; and
a passivation layer extending between the DTI region and the SPAD region; and
a contact disposed on the front surface of the sensor wafer, the contact electrically connected to the lateral shield and the passivation layer.

8. The back-illuminated SPAD of claim 7, further comprising:
a circuit wafer stacked with and attached to the front surface of the sensor wafer.

9. The back-illuminated SPAD of claim 7, wherein:
the SPAD region comprises:
an anode region; and
a cathode region adjacent the front surface of the sensor wafer.

10. The back-illuminated SPAD of claim 9, wherein:
the anode region comprises an anode gradient layer; and
the passivation layer and the anode gradient layer have a same doping.

11. The back-illuminated SPAD of claim 7, further comprising:
a light shield disposed on the back surface of the sensor wafer, over the DTI region.

12. A back-illuminated single-photon avalanche detector (SPAD, comprising:
a sensor wafer having a back surface opposite a front surface, the sensor wafer comprising:
a SPAD region configured to receive photons of light entering through the back surface of the sensor wafer;
a deep trench isolation (DTI) region surrounding the SPAD region and extending from the front surface to the back surface of the sensor wafer; and
a pinning layer on a side of the DTI region, the pinning layer extending from the front surface to the back surface of the sensor wafer and flaring out toward the back surface.

13. A device, comprising:
a sensor wafer having a back surface opposite a front surface, the sensor wafer comprising,
an array of back-illuminated single-photon avalanche diodes (SPADs) including,
a SPAD region having an anode region configured to receive photons of light entering through the back surface of the sensor wafer;
a deep trench isolation (DTI) region surrounding the SPAD region and extending from the front surface to the back surface of the sensor wafer;
a pinning layer on a side of the DTI region adjacent the SPAD region; and
a contact disposed on the front surface of the sensor wafer; wherein,
a voltage applied to the contact applies a bias voltage to the pinning layer.

14. The device of claim 13, wherein the sensor wafer further comprises:
a diffusion region adjacent the front surface of the sensor wafer and electrically connected to the contact; and
a doped well disposed along the pinning layer and contacting the diffusion region.

15. The device of claim 13, wherein the pinning layer extends from the front surface to the back surface of the sensor wafer.

16. The device of claim 15, wherein the pinning layer flares out toward the back surface.

17. The device of claim 13, wherein:
the SPAD region is a first SPAD region;
the array of back-illuminated SPADs further includes,
a second SPAD region;
a third SPAD region; and
a fourth SPAD region;
the first SPAD region, the second SPAD region, the third SPAD region, and the fourth SPAD region are arranged in a 2×2 array;
the DTI region further surrounds the second SPAD region, the third SPAD region, and the fourth SPAD region;
the sensor wafer includes a second contact disposed on the front surface of the sensor wafer; and
a second voltage applied to the second contact applies a second bias voltage to the first SPAD region, the second SPAD region, the third SPAD region, and the fourth SPAD region.

18. The device of claim 17, wherein:
the DTI region defines at least a first DTI wall and a second DTI wall; and
the second contact is disposed at an intersection of the first DTI wall and the second DTI wall, between the first SPAD region, the second SPAD region, the third SPAD region, and the fourth SPAD region.

* * * * *